United States Patent
Ladd et al.

(10) Patent No.: US 9,965,435 B2
(45) Date of Patent: May 8, 2018

(54) COMMUNICATION LOW-SPEED AND HIGH-SPEED PARALLEL BIT STREAMS OVER A HIGH-SPEED SERIAL BUS

(71) Applicant: QUALCOMM Incorporated, San Diego, CA (US)

(72) Inventors: William Knox Ladd, Raleigh, NC (US); Kevin Wayne Spears, Raleigh, NC (US); Mark Wesley Vilas, Raleigh, NC (US); Zhi Zhu, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 253 days.

(21) Appl. No.: 14/939,020

(22) Filed: Nov. 12, 2015

(65) Prior Publication Data

US 2017/0139872 A1  May 18, 2017

(51) Int. Cl.
| | |
|---|---|
| *G06F 13/40* | (2006.01) |
| *G06F 13/42* | (2006.01) |
| *G06F 13/38* | (2006.01) |
| *G06F 13/362* | (2006.01) |
| *H03M 9/00* | (2006.01) |

(52) U.S. Cl.
CPC ........ *G06F 13/4282* (2013.01); *G06F 13/362* (2013.01); *G06F 13/385* (2013.01); *G06F 13/4027* (2013.01); *H03M 9/00* (2013.01)

(58) Field of Classification Search
USPC .................................. 710/104–110, 305–315
See application file for complete search history.

(56) References Cited

U.S. PATENT DOCUMENTS

| | | | |
|---|---|---|---|
| 7,656,323 B2 | 2/2010 | Bereza et al. | |
| 8,102,288 B2 * | 1/2012 | Koyanagi | H03M 9/00 341/100 |
| 8,510,487 B2 | 8/2013 | Ruberg et al. | |

(Continued)

OTHER PUBLICATIONS

International Search Report and Written Opinion for PCT/US2016056730, dated Jan. 23, 2017, 13 pages.

(Continued)

*Primary Examiner* — Raymond Phan
(74) *Attorney, Agent, or Firm* — Withrow & Terranova, PLLC

(57) ABSTRACT

Aspects disclosed in the detailed description include communicating low-speed and high-speed parallel bit streams over a high-speed serial bus. In one aspect, a data transmitting circuit converts a low-speed parallel bit stream into a high-speed parallel bit stream and then serializes the converted high-speed parallel bit stream based on a high-speed reference frequency. In another aspect, a data receiving circuit recovers the low-speed parallel bit stream from the high-speed parallel bit stream if the low-speed parallel bit stream is determined to exist in the high-speed parallel bit stream. By serializing and deserializing the low-speed parallel bit stream based on the high-speed reference frequency, it is possible to communicate the high-speed parallel bit stream and the low-speed parallel bit stream over the high-speed serial bus without requiring additional serializers and deserializers, thus reducing component costs and implementation complexities in both the transmitting circuit and the receiving circuit.

21 Claims, 14 Drawing Sheets

(56) References Cited

U.S. PATENT DOCUMENTS

| | | |
|---|---|---|
| 8,692,699 B2 | 4/2014 | Yang |
| 8,750,430 B2 * | 6/2014 | Koyanagi ............... H04L 7/033 327/144 |
| 8,924,620 B2 | 12/2014 | Harriman et al. |
| 2005/0286643 A1 | 12/2005 | Ozawa et al. |
| 2010/0328118 A1 | 12/2010 | Koyanagi |
| 2011/0249775 A1 | 10/2011 | Koyanagi |
| 2013/0342249 A1 | 12/2013 | Yang |
| 2015/0002117 A1 | 1/2015 | Labib et al. |

OTHER PUBLICATIONS

Second Written Opinion for PCT/US20161056730, dated Oct. 12, 2017, 9 pages.

* cited by examiner

COMMUNICATION LOW-SPEED AND HIGH-SPEED PARALLEL BIT STREAMS OVER A HIGH-SPEED SERIAL BUS

BACKGROUND

I. Field of the Disclosure

The technology of the disclosure relates generally to communicating parallel data over a serial bus.

II. Background

Mobile communication devices have become increasingly common in current society. The prevalence of these mobile communication devices is driven in part by the many functions that are now enabled on such devices. Increased processing capabilities in such devices means that mobile communication devices have evolved from pure communication tools into sophisticated mobile entertainment centers, thus enabling enhanced user experiences.

As more and more high performance peripheral devices, such as high-resolution cameras, high-definition displays, and high-throughput storage media, are added into the mobile communication devices, application processors that control the high performance peripheral devices demand a high bandwidth data pipe for communicating with the high performance peripheral devices in real time. Recognizing the needs for such high data bandwidth, the Mobile Industry Processor Interface (MIPI) Alliance defined a variety of serial data buses to enable high throughput data communications between the application processors and the high performance peripheral devices. One such MIPI serial data bus is known as M-PHY, which is capable of supporting up to six gigabits per second (6 Gbps) data throughput.

Communication of parallel bit streams over a serial data bus such as M-PHY can be achieved via a serializer and deserializer pair. On a transmitting end of the serial data bus, the serializer serializes the parallel bit streams into a serial bit stream according to a reference clock. On a receiving end of the serial data bus, the deserializer deserializes the serial bit stream into the parallel bit streams, also according to the reference clock. For the serializer and deserializer pair to function correctly, the reference clock needs to be a multiple or a divisor of a bitrate of the parallel bit streams. In this regard, additional serializer and deserializer pairs may be needed to communicate additional parallel bit streams if the additional parallel bit streams correspond to a different bitrate. As a result, component costs and implementation complexities will increase on both the transmitting end and the receiving end of the serial data bus.

SUMMARY OF THE DISCLOSURE

Aspects disclosed in the detailed description include communicating low-speed and high-speed parallel bit streams over a high-speed serial bus. In one aspect, a data transmitting circuit converts a low-speed parallel bit stream into a high-speed parallel bit stream and then serializes the converted high-speed parallel bit stream based on a high-speed reference frequency. In another aspect, a data receiving circuit recovers the low-speed parallel bit stream from the high-speed parallel bit stream if the low-speed parallel bit stream is determined to exist in the high-speed parallel bit stream. By serializing and deserializing the low-speed parallel bit stream based on the high-speed reference frequency, it is possible to communicate the high-speed parallel bit stream and the low-speed parallel bit stream over the high-speed serial bus without requiring additional serializers and deserializers, thus reducing component costs and implementation complexities in both the transmitting circuit and the receiving circuit.

In one aspect, a data transmitting circuit is provided. The data transmitting circuit comprises a serializer circuit configured to serialize a high-speed parallel bit stream corresponding to a high-speed bitrate based on a high-speed reference frequency to generate a high-speed serial bit stream for transmission over a high-speed serial bus. The data transmitting circuit also comprises a data processing circuit. The data processing circuit is configured to receive a low-speed parallel bit stream corresponding to a low-speed bitrate slower than the high-speed bitrate. The data processing circuit is also configured to convert the low-speed parallel bit stream into the high-speed parallel bit stream corresponding to the high-speed bitrate. The data processing circuit is also configured to provide the converted high-speed parallel bit stream to the serializer circuit.

In another aspect, a method for transmitting a low-speed parallel bit stream over a high-speed serial bus is provided. The method comprises receiving the low-speed parallel bit stream corresponding to a low-speed bitrate. The method also comprises converting the low-speed parallel bit stream into a high-speed parallel bit stream corresponding to a high-speed bitrate faster than the low-speed bitrate. The method also comprises serializing the converted high-speed parallel bit stream based on a high-speed reference frequency to generate a high-speed serial bit stream for transmission over the high-speed serial bus.

In another aspect, a data receiving circuit is provided. The data receiving circuit comprises a deserializer circuit configured to deserialize a high-speed serial bit stream received over a high-speed serial bus based on a high-speed reference frequency to generate a high-speed parallel bit stream corresponding to a high-speed bitrate. The data receiving circuit also comprises a data processing circuit. The data processing circuit is configured to determine whether a low-speed parallel bit stream corresponding to a low-speed bitrate slower than the high-speed bitrate exists in the high-speed parallel bit stream. The data processing circuit is also configured to recover the low-speed parallel bit stream from the high-speed parallel bit stream if the low-speed parallel bit stream is determined to exist in the high-speed parallel bit stream.

In another aspect, a method for receiving a low-speed parallel bit stream over a high-speed serial bus is provided. The method comprises deserializing a high-speed serial bit stream received over the high-speed serial bus based on a high-speed reference frequency to generate a high-speed parallel bit stream corresponding to a high-speed bitrate. The method also comprises determining whether the low-speed parallel bit stream corresponding to a low-speed bitrate slower than the high-speed bitrate exists in the high-speed parallel bit stream. The method also comprises recovering the low-speed parallel bit stream from the high-speed parallel bit stream if the low-speed parallel bit stream is determined to exist in the high-speed parallel bit stream.

In another aspect, a data transmitting circuit is provided. The data transmitting circuit comprises a serializer circuit configured to serialize a high-speed parallel bit stream corresponding to a high-speed bitrate based on a high-speed reference frequency to generate a high-speed serial bit stream for transmission over a high-speed serial bus. The data transmitting circuit also comprises a data processing circuit. The data processing circuit is configured to receive a low-speed parallel bit stream corresponding to a low-speed bitrate slower than the high-speed bitrate. A division of the high-speed bitrate by the low-speed bitrate has a remainder. The data processing circuit is also configured to define a first encoding bitrate faster than the low-speed bitrate. The first encoding bitrate is a divisor of the high-speed bitrate. The data processing circuit is also configured to define a second encoding bitrate slower than the low-speed bitrate. The second encoding bitrate is a divisor of the high-speed bitrate. The data processing circuit is also configured to determine an encoding bitrate ratio between the first encoding bitrate and the second encoding bitrate. The data processing circuit is also configured to convert the low-speed parallel bit stream into the high-speed parallel bit stream corresponding to the high-speed bitrate based on the first encoding bitrate and the second encoding bitrate and according to the encoding bitrate ratio. The data processing circuit is also configured to provide the converted high-speed parallel bit stream to the serializer circuit.

DETAILED DESCRIPTION

Figure 1A:
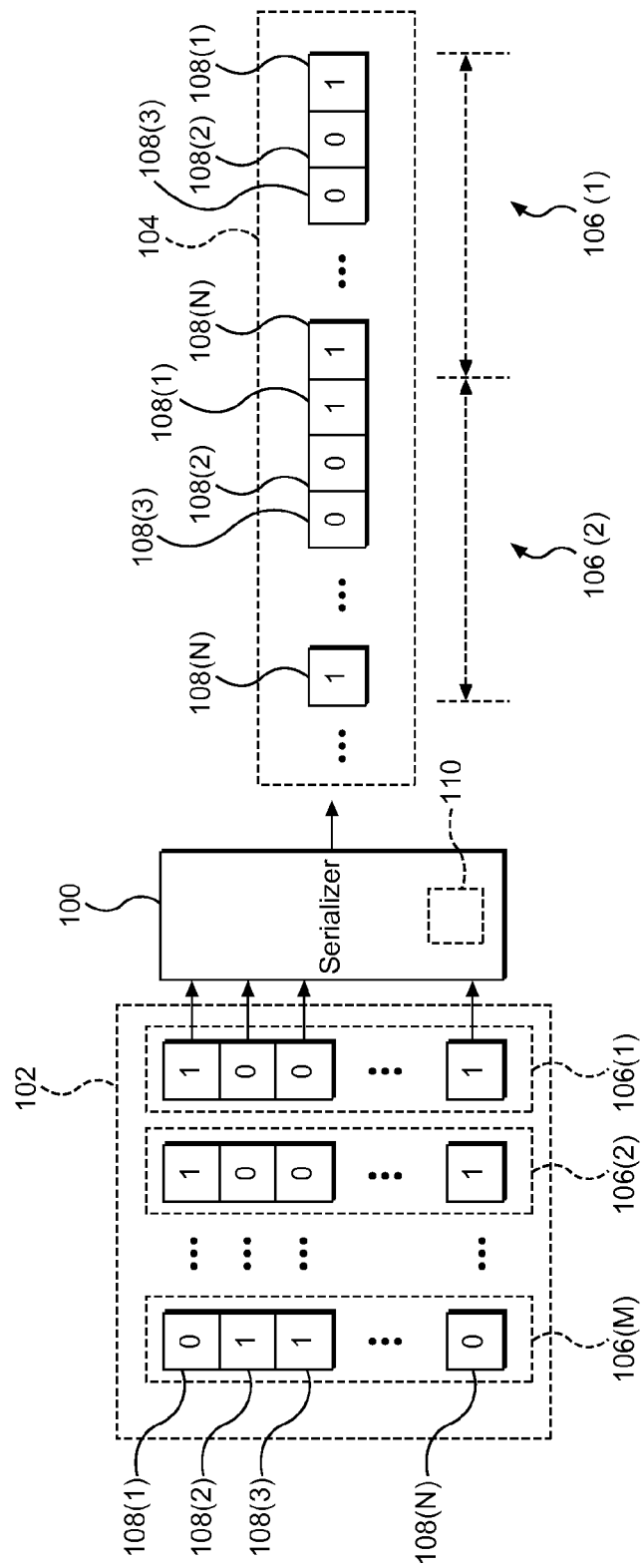
FIG. 1A is a schematic diagram of an exemplary serializer configured to serialize a high-speed parallel bit stream into a high-speed serial bit stream.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

Aspects disclosed in the detailed description include communicating low-speed and high-speed parallel bit streams over a high-speed serial bus. In one aspect, a data transmitting circuit converts a low-speed parallel bit stream into a high-speed parallel bit stream and then serializes the converted high-speed parallel bit stream based on a high-speed reference frequency. In another aspect, a data receiving circuit recovers the low-speed parallel bit stream from the high-speed parallel bit stream if the low-speed parallel bit stream is determined to exist in the high-speed parallel bit stream. By serializing and deserializing the low-speed parallel bit stream based on the high-speed reference frequency, it is possible to communicate the high-speed parallel bit stream and the low-speed parallel bit stream over the high-speed serial bus without requiring additional serializers and deserializers, thus reducing component costs and implementation complexities in both the transmitting circuit and the receiving circuit.

Figure 1B:
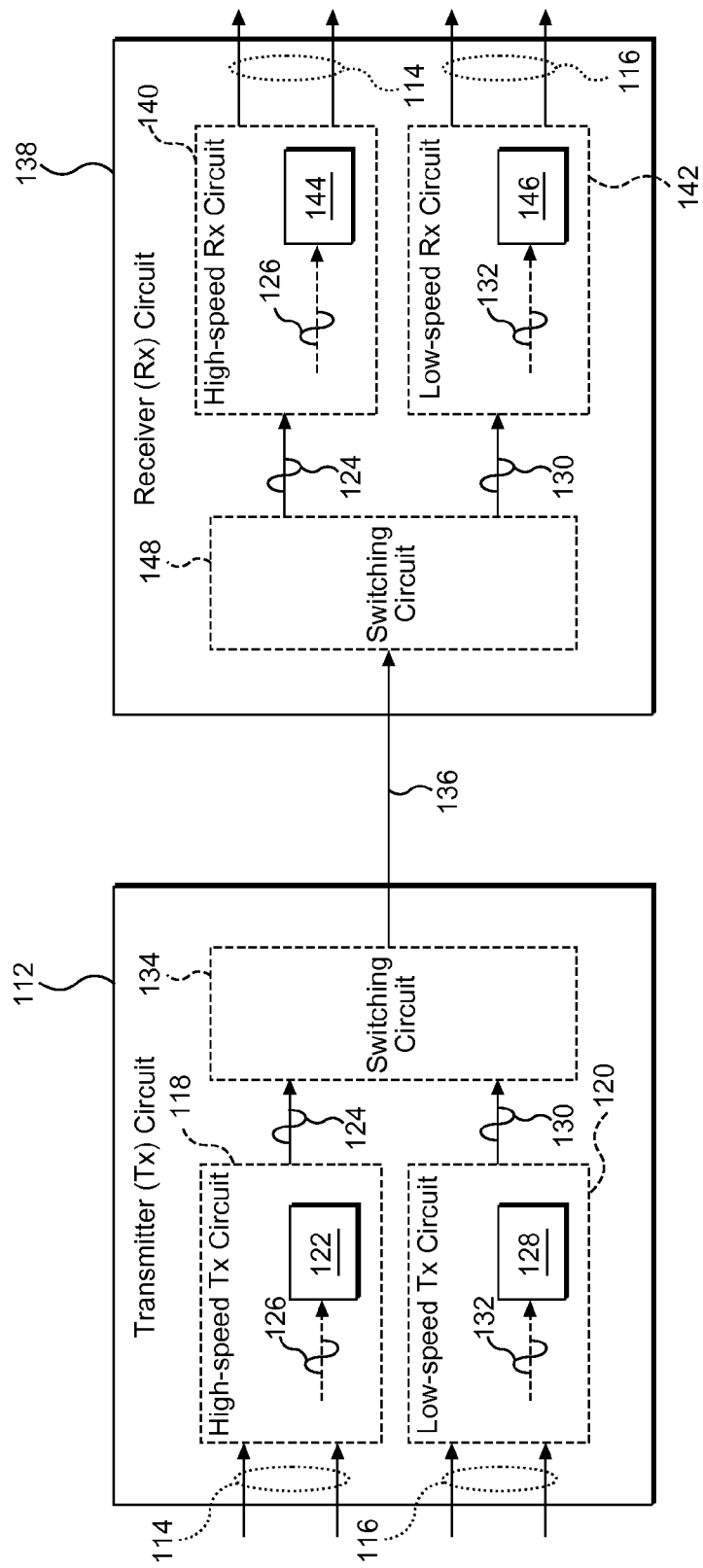
FIG. 1B is a schematic diagram of an exemplary conventional transmitter circuit configured to transmit a high-speed parallel bit stream and a low-speed parallel bit stream using a high-speed transmitter circuit and a low-speed transmitter circuit, respectively.

Before discussing exemplary aspects of communicating low-speed and high-speed parallel bit streams over a high-speed serial bus that include specific aspects of the present disclosure, a brief overview of a serializer configured to serialize a parallel bit stream into a serial bit stream and a conventional transmitter/receiver circuit configured to serialize/deserialize a high-speed parallel bit stream and a low-speed parallel bit stream using separate serializers/deserializers are first provided in FIGS. 1A and 1B. The discussion of specific exemplary aspects of communicating low-speed and high-speed parallel bit streams over a high-speed serial bus starts below with reference to FIG. 2.

In this regard, FIG. 1 is a schematic diagram of an exemplary serializer 100 configured to serialize a high-speed parallel bit stream 102 into a high-speed serial bit stream 104. The high-speed parallel bit stream 102 includes a plurality of binary bit periods 106(1)-106(M). Each of the plurality of binary bit periods 106(1)-106(M) includes a plurality of parallel binary bits 108(1)-108(N). For each of the plurality of binary bit periods 106(1)-106(M), the serializer 100 serializes the plurality of parallel binary bits 108(1)-108(N) into the high-speed serial bit stream 104. The serializer 100 serializes the high-speed parallel bit stream 102 based on a reference frequency provided by a reference clock 110 (e.g., an oscillator). In many communication systems, the high-speed parallel bit stream 102 and the high-speed serial bit stream 104 are the same bitrate. Therefore, it is necessary for the reference frequency of the serializer 100 to be a multiple or a divisor of the bitrate corresponding to the high-speed parallel bit stream 102 and the high-speed serial bit stream 104. Otherwise, it may not be possible to maintain the high-speed parallel bit stream 102 and the high-speed serial bit stream 104 in the same bitrate. For example, if the bitrate of the high-speed parallel bit stream 102 and the high-speed serial bit stream 104 is six gigabits per second (6 Gbps), the serializer 100 may be able to serialize the high-speed parallel bit stream 102 if the reference frequency is provided in three hundred megahertz (300 MHz), six hundred megahertz (600 MHz), and so on.

As such, it may not be possible for the serializer 100 to serialize properly another parallel bit stream corresponding to a different bitrate based on the reference frequency provided by the reference clock 110, especially if the reference frequency is not a multiple or divisor of the different bitrate. In this regard, FIG. 1B is a schematic diagram of an exemplary conventional transmitter circuit 112 configured to transmit a high-speed parallel bit stream 114 and a low-speed parallel bit stream 116 using a high-speed transmitter circuit 118 and a low-speed transmitter circuit 120, respectively.

With reference to FIG. 1B, the high-speed transmitter circuit 118 includes a first serializer circuit 122 configured to serialize the high-speed parallel bit stream 114 to generate a high-speed serial bit stream 124 based on a high-speed reference frequency 126. The high-speed parallel bit stream 114 corresponds to a high-speed bitrate that is a multiple of the high-speed reference frequency 126. The low-speed transmitter circuit 120 includes a second serializer circuit 128 configured to serialize the low-speed parallel bit stream 116 to generate a low-speed serial bit stream 130 based on a low-speed reference frequency 132. The low-speed parallel bit stream 116 corresponds to a low-speed bitrate that is a multiple of the low-speed reference frequency 132.

The conventional transmitter circuit 112 may also include a switching circuit 134 that selectively couples the high-speed transmitter circuit 118 or the low-speed transmitter circuit 120 to a serial bus 136. When the switching circuit 134 couples the high-speed transmitter circuit 118 to the serial bus 136, the conventional transmitter circuit 112 transmits the high-speed serial bit stream 124 over the serial bus 136. When the switching circuit 134 couples the low-speed transmitter circuit 120 to the serial bus 136, the conventional transmitter circuit 112 transmits the low-speed serial bit stream 130 over the serial bus 136.

The serial bus 136 is coupled to a conventional receiver circuit 138 that includes a high-speed receiver circuit 140 and a low-speed receiver circuit 142. The high-speed receiver circuit 140 includes a first deserializer circuit 144 configured to deserialize the high-speed serial bit stream 124 to generate the high-speed parallel bit stream 114 based on the high-speed reference frequency 126. The low-speed receiver circuit 142 includes a second deserializer circuit 146 configured to deserialize the low-speed serial bit stream 130 to generate the low-speed parallel bit stream 116 based on the low-speed reference frequency 132.

The conventional receiver circuit 138 may also include a switching circuit 148 that selectively couples the high-speed receiver circuit 140 or the low-speed receiver circuit 142 to the serial bus 136. The conventional receiver circuit 138 receives the high-speed serial bit stream 124 over the serial bus 136 when the switching circuit 148 couples the high-speed receiver circuit 140 to the serial bus 136. The conventional receiver circuit 138 receives the low-speed serial bit stream 130 over the serial bus 136 when the switching circuit 148 couples the low-speed receiver circuit 142 to the serial bus 136.

With continuing reference to FIG. 1B, the conventional transmitter circuit 112 and the conventional receiver circuit 138 rely on the low-speed transmitter circuit 120 and the low-speed receiver circuit 142 to transmit and receive the low-speed parallel bit stream 116, respectively. The separated low-speed transmitter circuit 120 and the separated low-speed receiver circuit 142 increase component costs and the footprint of the conventional transmitter circuit 112 and the conventional receiver circuit 138. Furthermore, a complicated control mechanism may be needed to ensure synchronization between the switching circuit 134 and the switching circuit 148, thus increasing complexities of the conventional transmitter circuit 112 and the conventional receiver circuit 138. Hence, it may be desirable to communicate the high-speed parallel bit stream 114 and the low-speed parallel bit stream 116 based on the high-speed transmitter circuit 118 and the high-speed receiver circuit 140.

Figure 2:
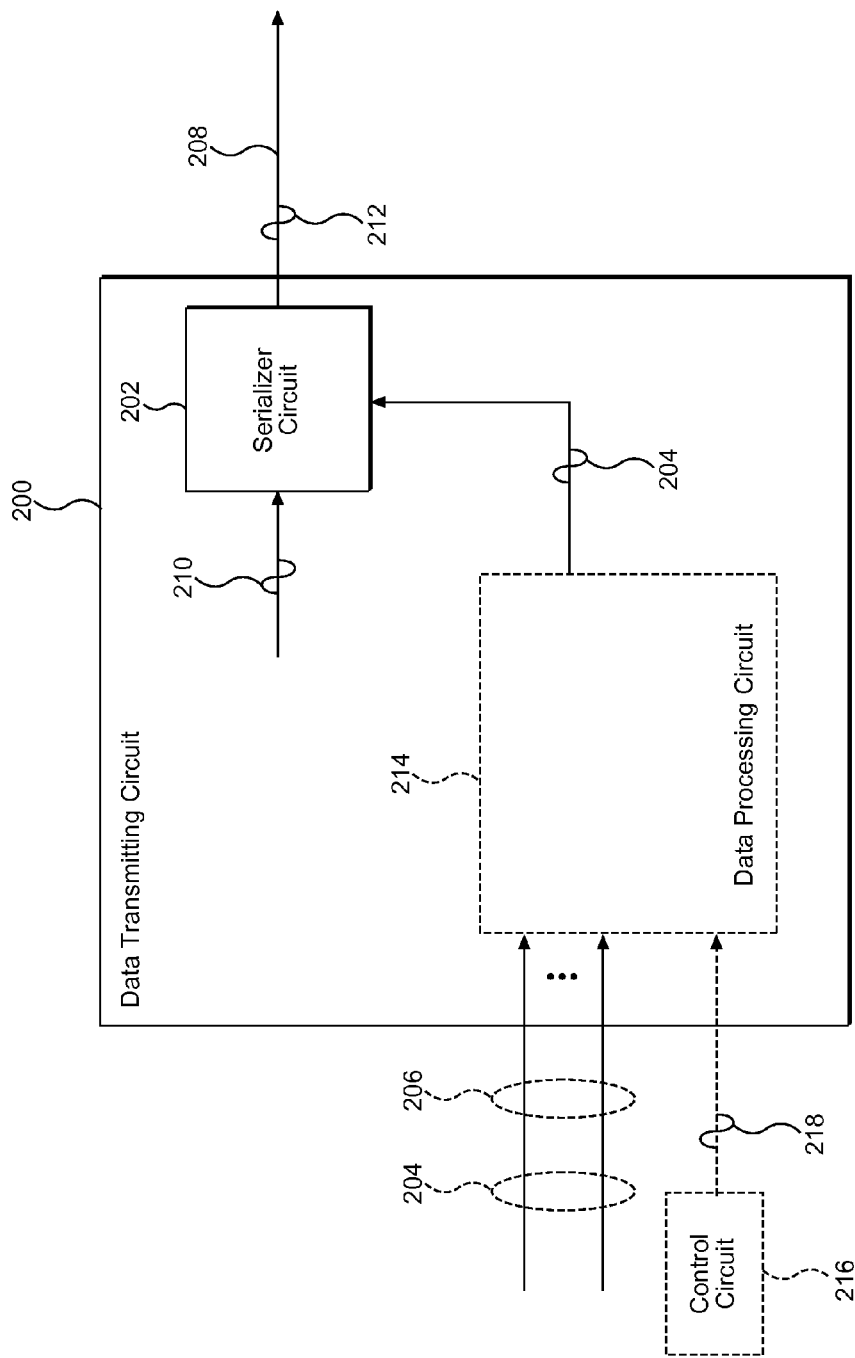
FIG. 2 is a schematic diagram of an exemplary data transmitting circuit in which a serializer circuit is configured to serialize a high-speed parallel bit stream and a low-speed parallel bit stream for transmission over a high-speed serial bus.

In this regard, FIG. 2 is a schematic diagram of an exemplary data transmitting circuit 200 in which a serializer circuit 202 is configured to serialize a high-speed parallel bit stream 204 and a low-speed parallel bit stream 206 for transmission over a high-speed serial bus 208. With reference to FIG. 2, the high-speed parallel bit stream 204 corresponds to a high-speed bitrate. The serializer circuit 202 is configured to serialize the high-speed parallel bit stream 204 based on a high-speed reference frequency 210 to generate a high-speed serial bit stream 212 for transmission over the high-speed serial bus 208. In a non-limiting example, the high-speed bitrate may be 6 Gbps and the high-speed reference frequency 210 may be 600 MHz. As such, the high-speed reference frequency 210 is a divisor of the high-speed bitrate, thus enabling the serializer circuit 202 to serialize properly the high-speed parallel bit stream 204.

The low-speed parallel bit stream 206, on the other hand, corresponds to a low-speed bitrate that is slower than the high-speed bitrate. In a non-limiting example, the low-speed bitrate may be one hundred seventy-five megabits per second (175 Mbps). Furthermore, the low-speed bitrate (e.g., 175 Mbps) may not be a divisor of the high-speed reference frequency 210 (e.g., 600 MHz). As such, the low-speed bitrate is also not a divisor of the high-speed bitrate (e.g., 6 Gbps), and division of the high-speed bitrate by the low-speed bitrate will yield a remainder. In this regard, in a non-limiting example, it may be necessary to first adjust (e.g., increase or decrease) the low-speed bitrate to an adjusted low-speed bitrate that is a divisor of the high-speed bitrate. For example, it may be possible to increase the low-speed bitrate from 175 Mbps to the adjusted low-speed bitrate of 200 Mbps. In an exemplary aspect, the low-speed parallel bit stream 206 may be a pulse width modulated (PWM) parallel bit stream. As is further discussed later in FIG. 7, the adjustment may be accomplished by padding binary ones (1s) and zeros (0s) into the PWM parallel bit stream.

To serialize the low-speed parallel bit stream 206 using the serializer circuit 202 based on the high-speed reference frequency 210, a data processing circuit 214 is provided in the data transmitting circuit 200. The data processing circuit 214 is configured to convert the low-speed parallel bit stream 206 into the high-speed parallel bit stream 204 and provide the converted high-speed parallel bit stream 204 to the serializer circuit 202. By converting the low-speed parallel bit stream 206 into the high-speed parallel bit stream 204, the converted high-speed parallel bit stream 204 corresponds to the high-speed bitrate. The serializer circuit 202 then serializes the converted high-speed parallel bit stream 204 based on the high-speed reference frequency 210 to generate the high-speed serial bit stream 212.

With continuing reference to FIG. 2, if the data processing circuit 214 receives the high-speed parallel bit stream 204, the data processing circuit 214 simply passes the high-speed parallel bit stream 204 to the serializer circuit 202. The data processing circuit 214 may be communicatively coupled to a control circuit 216 that may be provided inside or outside the data transmitting circuit 200. The control circuit 216 may configure the data processing circuit 214 to pass the high-speed parallel bit stream 204 or convert the low-speed parallel bit stream 206 based on a control signal 218. The control circuit 216 may also adjust the low-speed parallel bit stream 206 from the low-speed bitrate to the adjusted low-speed bitrate if the control circuit 216 determines that the low-speed bitrate is not a divisor of the high-speed bitrate.

Figure 3:
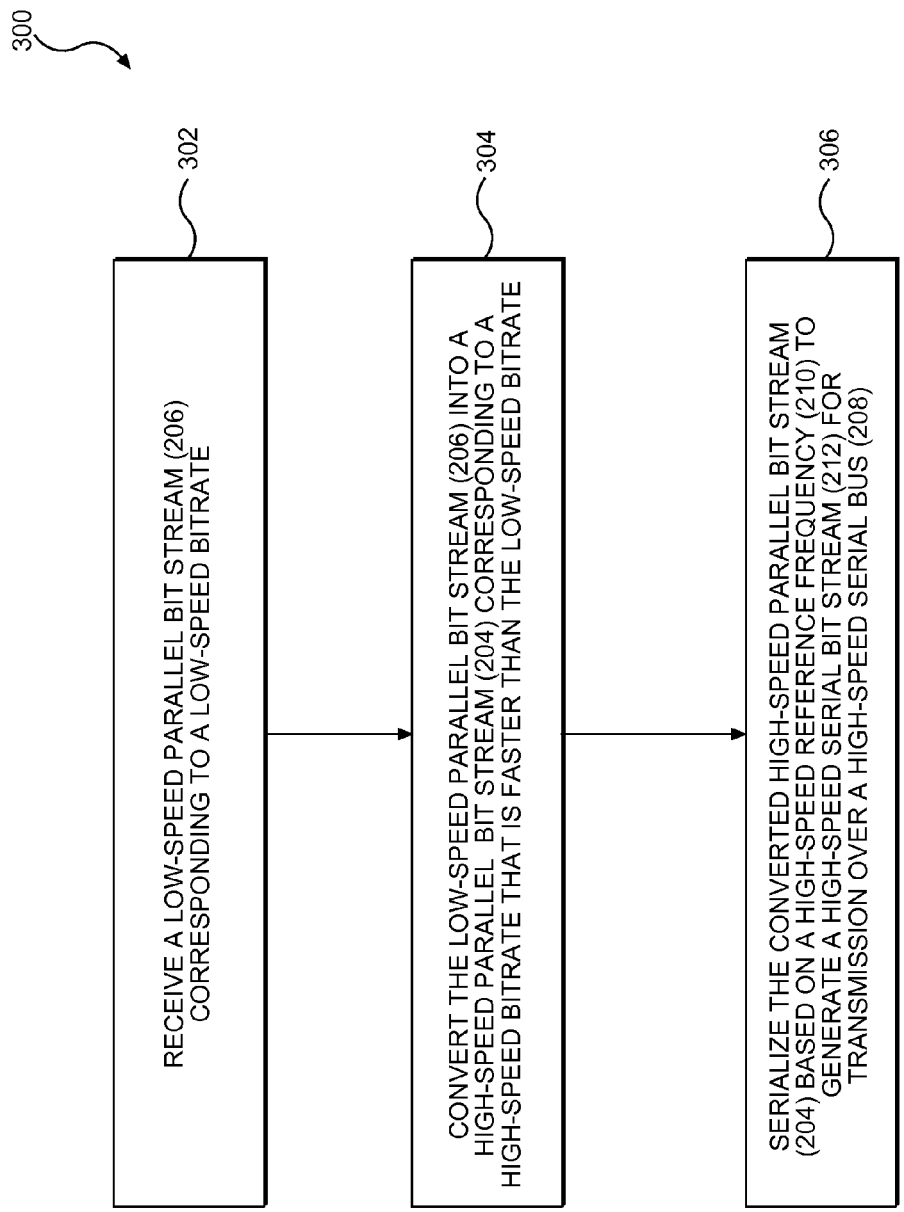
FIG. 3 is a flowchart illustrating an exemplary transmission process that the data transmitting circuit of FIG. 2 may employ to serialize the low-speed parallel bit stream for transmission over the high-speed serial bus.

FIG. 3 is a flowchart illustrating an exemplary transmission process 300 that the data transmitting circuit 200 of FIG. 2 may employ to serialize the low-speed parallel bit stream 206 for transmission over the high-speed serial bus 208. With reference to FIG. 3, the data transmitting circuit 200 receives the low-speed parallel bit stream 206 corresponding to the low-speed bitrate (block 302). The data transmitting circuit 200 subsequently converts the low-speed parallel bit stream 206 to the high-speed parallel bit stream 204 corresponding to the high-speed bitrate that is faster than the low-speed bitrate (block 304). The data transmitting circuit 200 then serializes the converted high-speed parallel bit stream 204 based on the high-speed reference frequency 210 to generate the high-speed serial bit stream 212 for transmission over the high-speed serial bus 208 (block 306).

Figure 4:
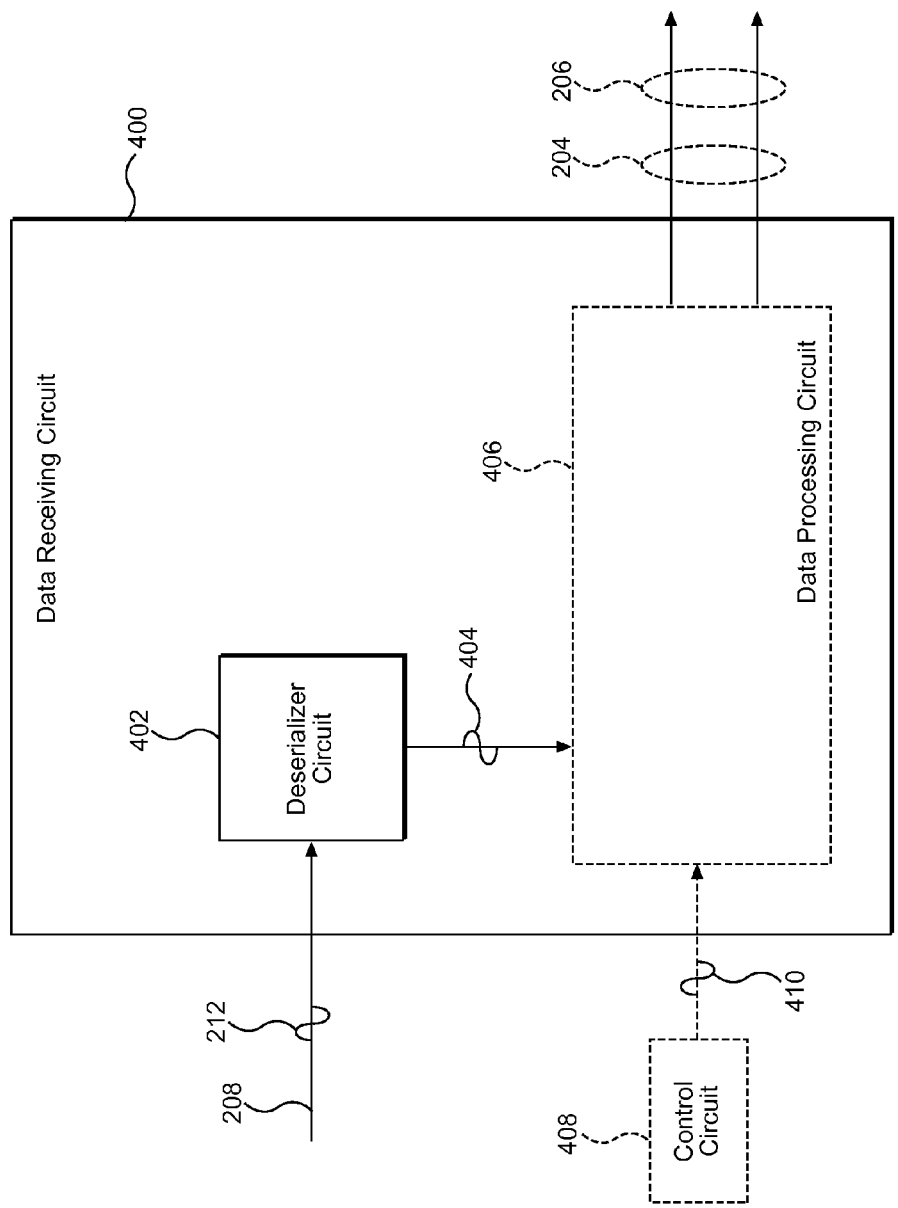
FIG. 4 is a schematic diagram of an exemplary data receiving circuit in which a deserializer circuit is configured to deserialize a high-speed serial bit stream received over the high-speed serial bus of FIG. 2 to regenerate the high-speed parallel bit stream and the low-speed parallel bit stream.

With reference back to FIG. 2, the high-speed serial bit stream 212, which may contain the high-speed parallel bit stream 204 or the low-speed parallel bit stream 206, may be received over the high-speed serial bus 208 and deserialized back to the high-speed parallel bit stream 204 or the low-speed parallel bit stream 206. In this regard, FIG. 4 is a schematic diagram of an exemplary data receiving circuit 400 in which a deserializer circuit 402 is configured to deserialize the high-speed serial bit stream 212 of FIG. 2 to regenerate the high-speed parallel bit stream 204 and a low-speed parallel bit stream 206. Common elements between FIGS. 2 and 4 are shown therein with common element numbers and thus, will not be re-described herein.

With reference to FIG. 4, the deserializer circuit 402 receives the high-speed serial bit stream 212 over the high-speed serial bus 208. As previously stated, the high-speed serial bit stream 212 may contain either the high-speed parallel bit stream 204 or the converted low-speed parallel bit stream 206. The deserializer circuit 402 deserializes the high-speed serial bit stream 212 into a high-speed parallel bit stream 404 that may contain either the high-speed parallel bit stream 204 or the converted low-speed parallel bit stream 206. A data processing circuit 406 receives the high-speed parallel bit stream 404 and determines whether the high-speed parallel bit stream 404 contains the low-speed parallel bit stream 206. If the high-speed parallel bit stream 404 is determined to contain the low-speed parallel bit stream 206, the data processing circuit 406 then recovers the low-speed parallel bit stream 206 from the high-speed parallel bit stream 404. If the high-speed parallel bit stream 404 does not contain the low-speed parallel bit stream 206, the data processing circuit 406 simply outputs the high-speed parallel bit stream 404 as the high-speed parallel bit stream 204.

In a non-limiting example, the data processing circuit 406 may be enabled or disabled by a control circuit 408 via a control signal 410. In this regard, the data processing circuit 406 recovers the low-speed parallel bit stream 206 from the high-speed parallel bit stream 404 when the control circuit 408 enables the data processing circuit 406. In contrast, the data processing circuit 406 simply outputs the high-speed parallel bit stream 404 as the high-speed parallel bit stream 204 when the control circuit 408 disables the data processing circuit 406.

Figure 5:
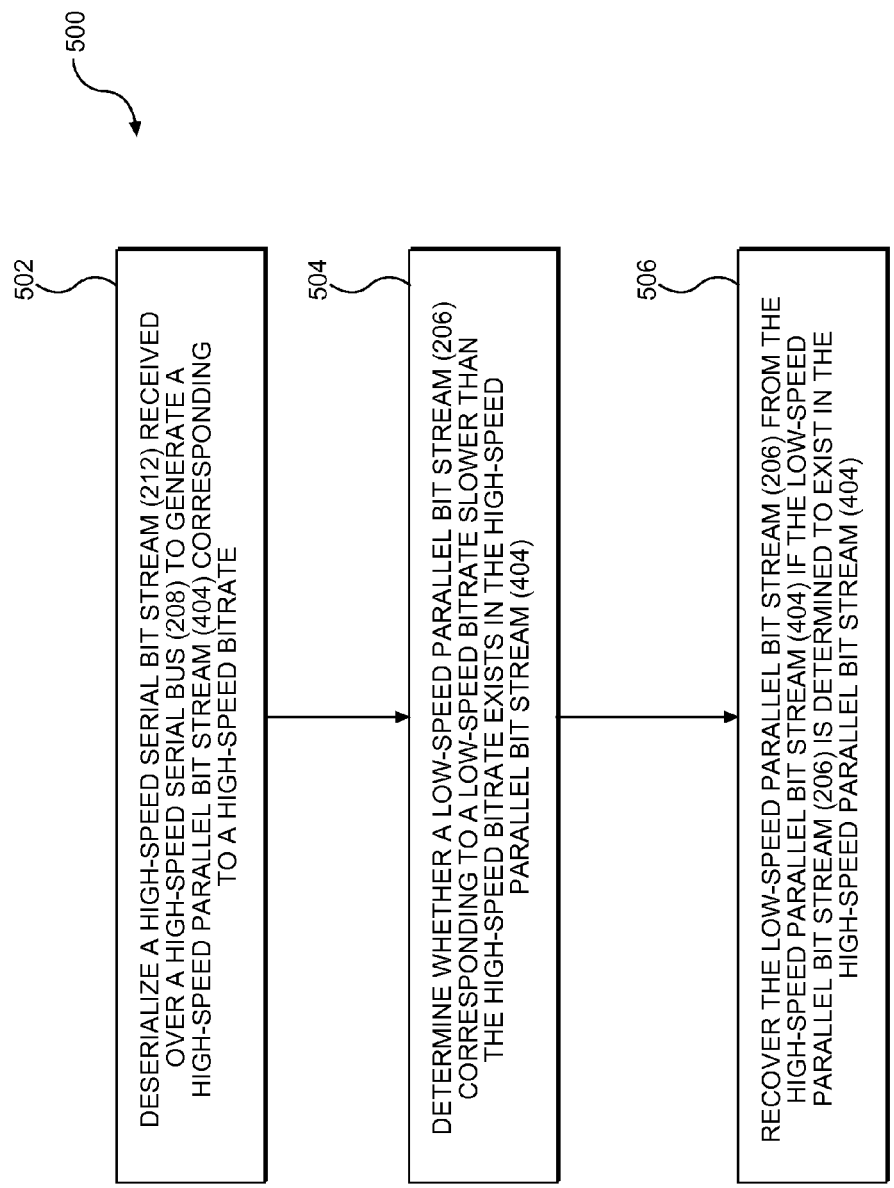
FIG. 5 is a flowchart illustrating an exemplary reception process that the data receiving circuit of FIG. 4 may employ to deserialize the high-speed serial bit stream to regenerate the high-speed parallel bit stream and the low-speed parallel bit stream.

FIG. 5 is a flowchart illustrating an exemplary reception process 500 that the data receiving circuit 400 of FIG. 4 may employ to deserialize the high-speed serial bit stream 212 to regenerate the high-speed parallel bit stream 204 and the low-speed parallel bit stream 206. With reference to FIG. 5, the data receiving circuit 400 deserializes the high-speed serial bit stream 212 received over the high-speed serial bus 208 to generate the high-speed parallel bit stream 404 corresponding to a high-speed bitrate (block 502). The data receiving circuit 400 subsequently determines whether the low-speed parallel bit stream 206, which corresponds to a low-speed bitrate slower than the high-speed bitrate, exists in the high-speed parallel bit stream 404 (block 504). The data receiving circuit 400 recovers the low-speed parallel bit stream 206 from the high-speed parallel bit stream 404 if the low-speed parallel bit stream 206 is determined to exist in the high-speed parallel bit stream 404 (block 506).

In a non-limiting example, the high-speed serial bus 208 of FIGS. 2 and 4 may be a MIPI Appliance (MIPI) high-speed serial bus, such as a MIPI M-PHY high-speed serial bus or a MIPI C-PHY high-speed serial bus. As such, the data transmitting circuit 200 of FIG. 2 may be adapted to transmit a PWM parallel bit stream as the low-speed parallel bit stream 206 using the serializer circuit 202. Likewise, the data receiving circuit 400 of FIG. 4 may be adapted to receive the PWM parallel bit stream as the low-speed parallel bit stream 206 using the deserializer circuit 402. Exemplary aspects related to transmitting and receiving the PWM parallel bit stream as the low-speed parallel bit stream 206 are discussed next.

PWM is a modulation technique for encoding analog information bits into digital pulse signals. In this regard, FIG. 6 is a schematic diagram of an exemplary analog format 600 and an exemplary digital format 602 of a PWM zero bit (PWM bit 0) and a PWM one bit (PWM bit 1).

Figure 6:
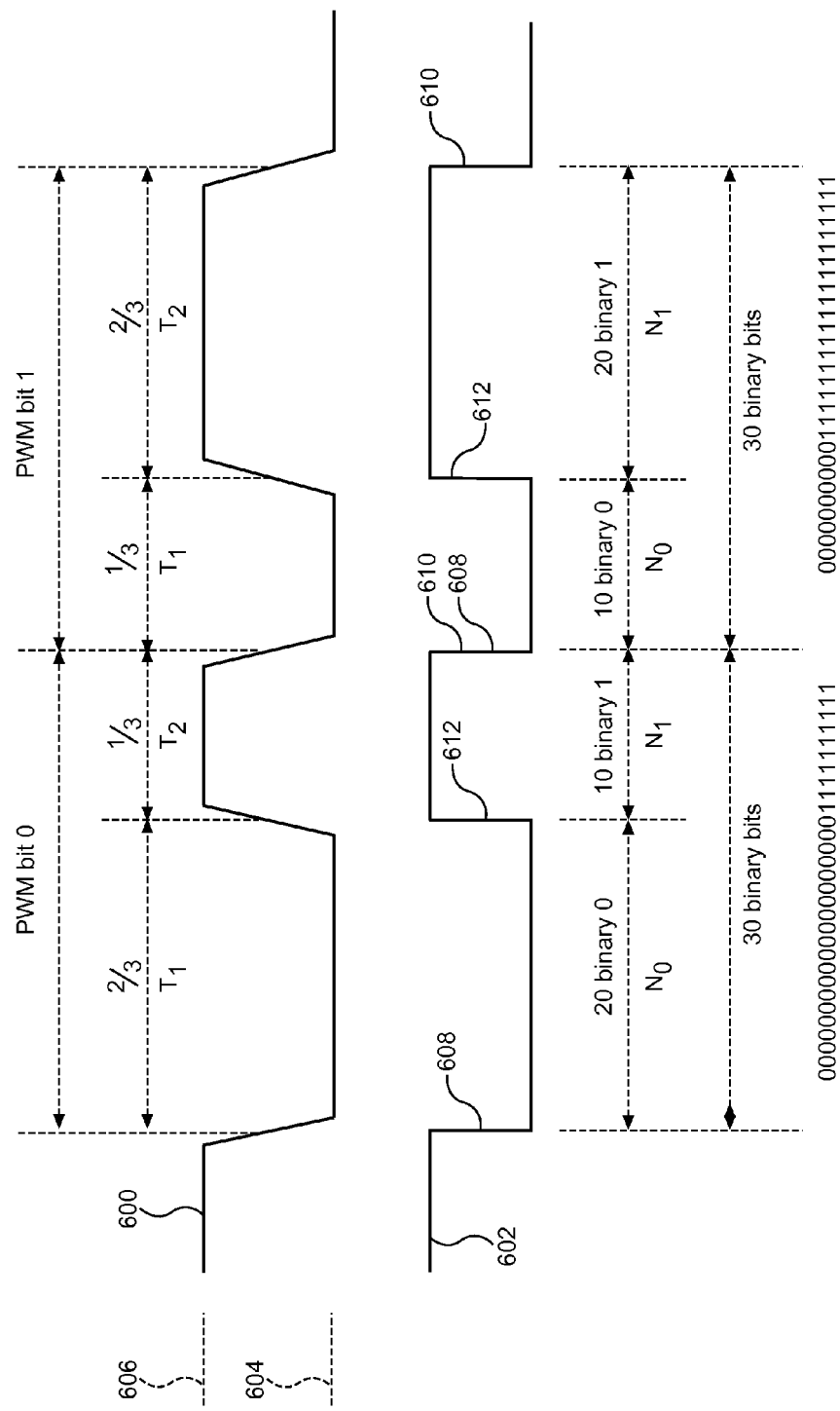
FIG. 6 is a schematic diagram of an exemplary analog format and an exemplary digital format of a pulse width modulated (PWM) zero bit and a PWM one bit.

With reference to FIG. 6, in the analog format 600, the PWM bit 0 and the PWM bit 1 may be encoded based on relative durations of $T_1$ and $T_2$ that correspond to a low voltage 604 and a high voltage 606, respectively. In other words, the PWM bit 0 and the PWM bit 1 are defined in the analog format 600 based on a ratio between $T_1$ and $T_2$. In a non-limiting example, as illustrated in FIG. 6, a two-to-one (2:1) ratio between $T_1$ and $T_2$ defines the PWM bit 0, and a one-to-two (1:2) ratio between $T_1$ and $T_2$ defines the PWM bit 1. It shall be appreciated that the PWM bit 0 and the PWM bit 1 may be defined based any ratio between $T_1$ and $T_2$ as long as the PWM bit 0 and the PWM bit 1 remain distinguishable.

In the digital format 602, the low voltage 604 and the high voltage 606 may be used to represent binary 0 and binary 1, respectively. As such, $T_1$ and $T_2$ may correspond to a number of binary 0s ($N_0$) and a number of binary 1s ($N_1$), respectively. In this regard, a ratio between $N_0$ and $N_1$ can be defined to represent PWM bit 0, and the PWM bit 1 in the digital format 602. According to the non-limiting example above, a 2:1 ratio between $N_0$ and $N_1$ defines the PWM bit 0, and a 1:2 ratio between $N_0$ and $N_1$ defines the PWM bit 1. As illustrated in FIG. 6, the PWM bit 0 and the PWM bit 1 may each be defined with thirty (30) binary bits. In this regard, the digital format 602 of the PWM bit 0 includes twenty (20) binary 0s followed by ten (10) binary 1s. Likewise, the digital format 602 of the PWM bit 1 includes 10 binary 0s followed by 20 binary 1s. It shall be appreciated that the PWM bit 0 and the PWM bit 1 may be defined by more or less than 30 binary bits as long as the 2:1 and the 1:2 ratios are maintained. It shall also be appreciated that the PWM bit 0 and the PWM bit 1 may be defined based on any ratio between $N_0$ and $N_1$ as long as the PWM bit 0 and the PWM bit 1 remain distinguishable. The ratio between $N_0$ and $N_1$ that defines the PWM bit 0 and the PWM bit 1 in the digital format 602 is hereinafter referred to as the "predefined PWM bit format."

With continuing reference to FIG. 6, because the PWM bit 0 and the PWM bit 1 are encoded in the digital format 602 with $N_0$ number of binary 0s followed by $N_1$ number of binary 1s, the PWM bit 0 and the PWM bit 1 start with a falling edge 608 and end with a falling edge 610. In addition, there is a rising edge 612 between the falling edge 608 and the falling edge 610. As is further discussed later in FIGS. 9 and 10, such characteristics can help the data processing circuit 406 of FIG. 4 to recover one or more PWM bits from the high-speed parallel bit stream 404.

Figure 7:
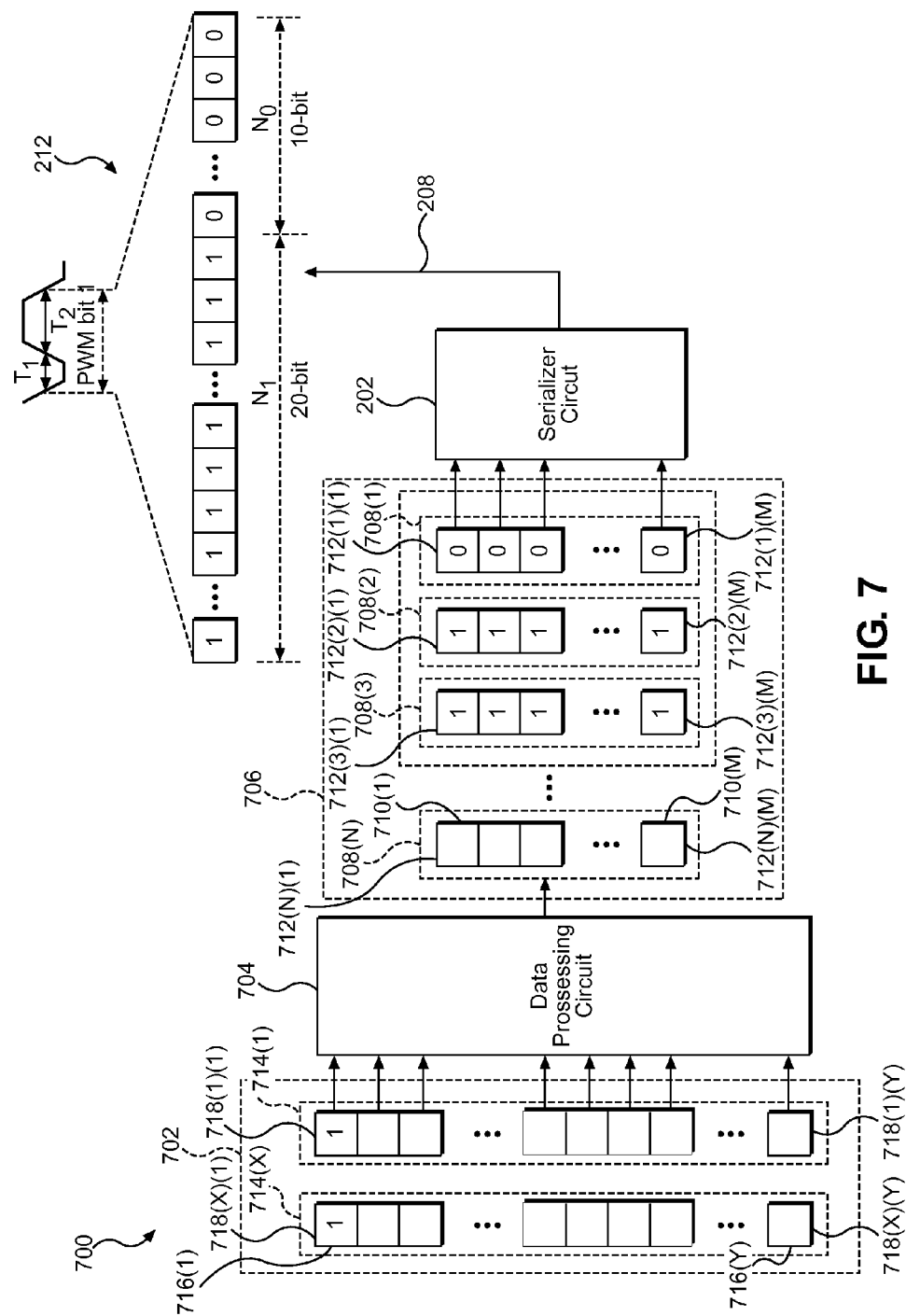
FIG. 7 is a schematic diagram of an exemplary data transmitting circuit configured to serialize a PWM parallel bit stream for transmission over the high-speed serial bus of FIG. 2.

FIG. 7 is a schematic diagram of an exemplary data transmitting circuit 700 configured to serialize a PWM parallel bit stream 702 for transmission over the high-speed serial bus 208 of FIG. 2. Common elements between FIGS. 2, 6, and 7 are shown therein with common element numbers and thus, will not be re-described herein.

With reference to FIG. 7, in a non-limiting example, the data transmitting circuit 700 may be a MIPI M-PHY transmitting circuit and the serializer circuit 202 may be a serializer/deserializer (SerDes) circuit. The PWM parallel bit stream 702 may be used to convey configuration information and, therefore, is typically provided to the data transmitting circuit 700 as the low-speed parallel bit stream 206 (not shown) to ensure reliability and robustness.

The data transmitting circuit 700 includes a data processing circuit 704 that is configured to convert the PWM parallel bit stream 702 into a high-speed parallel bit stream 706 corresponding to the high-speed bitrate that is faster than the low-speed bitrate. The high-speed parallel bit stream 706 includes a plurality of binary bit periods 708(1)-708(N). Each of the plurality of binary bit periods 708(1)-708(N) further includes a first number of parallel binary bits 710(1)-710(M). In this regard, the high-speed parallel bit stream 706 includes a plurality of binary bits 712(1)(1)-712(N)(M). The PWM parallel bit stream 702 includes a plurality of PWM bit periods 714(1)-714(X). Each of the plurality of PWM bit periods 714(1)-714(X) further includes a second number of parallel PWM bits 716(1)-716(Y). In this regard, the PWM parallel bit stream 702 includes a plurality of PWM bits 718(1)(1)-718(X)(Y).

For the convenience of discussion, non-limiting examples in Table 1 are used hereinafter to illustrate functional aspects and operational principles of transmitting and receiving the PWM parallel bit stream 702 over the high-speed serial bus 208. It shall be appreciated that the functional aspects and operation principles remain applicable beyond the non-limiting examples in Table 1.

TABLE 1

| Parameter | Value |
|---|---|
| High-speed bitrate of the high-speed parallel bit stream 706 | 6 Gbps |
| Low-speed bitrate of the PWM parallel bit stream 702 | 200 Mbps |
| High-speed reference frequency 210 (not shown) | 600 MHz |
| First number of parallel binary bits 710(1)-710(M) in each of the plurality of binary bit periods 708(1)-708(N) | 10-bit |
| Second number of parallel PWM bits 716(1)-716(Y) in each of the plurality of PWM bit periods 714(1)-714(X) | 20-bit |

With continuing reference to FIG. 7, according to the non-limiting examples in Table 1, the high-speed bitrate is a multiple of the low-speed bitrate and the high-speed reference frequency 210 (not shown). As such, it is possible for the data processing circuit 704 to convert the PWM parallel bit stream 702 to the high-speed parallel bit stream 706 for serialization by the serializer circuit 202 based on the high-speed reference frequency 210.

As mentioned earlier, the PWM parallel bit stream 702 includes the plurality of PWM bits 718(1)(1)-718(X)(Y). In this regard, the data processing circuit 704 is configured to convert each of the plurality of PWM bits 718(1)(1)-718(X)(Y) into one or more of the plurality of binary bit periods 708(1)-708(N).

In a non-limiting example, the PWM bit 718(1)(1) corresponds to the PWM bit 1 of FIG. 6. To convert the PWM bit 718(1)(1) according to the predefined PWM bit format, the data processing circuit 704 first determines a bit multiplier value ($M_B$) that defines a number of binary bits used to represent the PWM bit 718(1)(1) in the high-speed parallel bit stream 706. In this regard, $M_B$ shall equal a sum of $N_0$ and $N_1$, as shown in Equation 1 (Eq. 1) below.

$$M_B = N_0 + N_1 \quad \text{(Eq. 1)}$$

The data processing circuit 704 may calculate the $M_B$ by dividing the high-speed bit rate with the low-speed bitrate. According to the non-limiting example in Table 1, the high-speed bit rate and the low-speed bitrate are 6 Gbps and 200 Mbps, respectively. As such, $M_B$ may be computed based on Equation 2 (Eq. 2) below.

$$M_B = 6 \text{ Gbps} \div 200 \text{ Mbps} = 30 \quad \text{(Eq. 2)}$$

In this regard, the PWM bit 718(1)(1) is represented by 30 binary bits in the high-speed parallel bit stream 706. According to the non-limiting example in Table 1, each of the plurality of binary bit periods 708(1)-708(N) includes 10 parallel binary bits. As such, the PWM bit 718(1)(1) is encoded by the data processing circuit 704 into the binary bit periods 708(1)-708(3). Further according to the digital format 602 (not shown) of the PWM bit 1 as discussed with reference to FIG. 6, the binary bit period 708(1) includes 10 binary 0s and is equivalent to $N_0$ in the digital format 602 of the PWM bit 1. The binary bit periods 708(2)-708(3) each include 20 binary 1s and are equivalent to $N_1$ in the digital format 602 of the PWM bit 1.

In another non-limiting example, it may be necessary for the $M_B$ as calculated in Equation 2 to be a multiple of the first number of parallel binary bits 710(1)-710(M) in each of the plurality of binary bit periods 708(1)-708(N). This is to ensure that each of the plurality of PWM bits 718(1)(1)-718(X)(Y) can be encoded into a calculated number of binary bit periods among the plurality of binary bit periods 708(1)-708(N). In a non-limiting example, the calculated number of binary bit periods is a positive integer that is determined by dividing the $M_B$ by the first number of parallel binary bits 710(1)-710(M). Therefore, it may be necessary to adjust the $M_B$ if a division of the $M_B$ by the first number of parallel binary bits 710(1)-710(M) in each of the plurality of binary bit periods 708(1)-708(N) produces a remainder. For example, the low-speed bitrate of the PWM parallel bit stream 702 may be two hundred forty megabits per second (240 Mbps). As a result, a $M_B$ calculated based on Equation 2 equals twenty-five (25). Since the $M_B$ of 25 is not a multiple of the first number of parallel binary bits 710(1)-710(M), which is 10 according to Table 1, in each of the plurality of binary bit periods 708(1)-708(N), the data processing circuit 704 needs to adjust the $M_B$ to an integer value (e.g., 30) that is a multiple of the first number of parallel binary bits 710(1)-710(M).

With continuing reference to FIG. 7, the data processing circuit 704 outputs the binary bit periods 708(1)-708(3), which represent the PWM bit 718(1)(1), to the serializer circuit 202 that serializes the binary bit periods 708(1)-708(3) into the high-speed serial bit stream 212. Accordingly, the rest of the plurality of PWM bits 718(1)(2)-718(X)(Y) in the PWM parallel bit stream 702 can be encoded into the high-speed parallel bit stream 706 and serialized into the high-speed serial bit stream 212.

Figure 8:
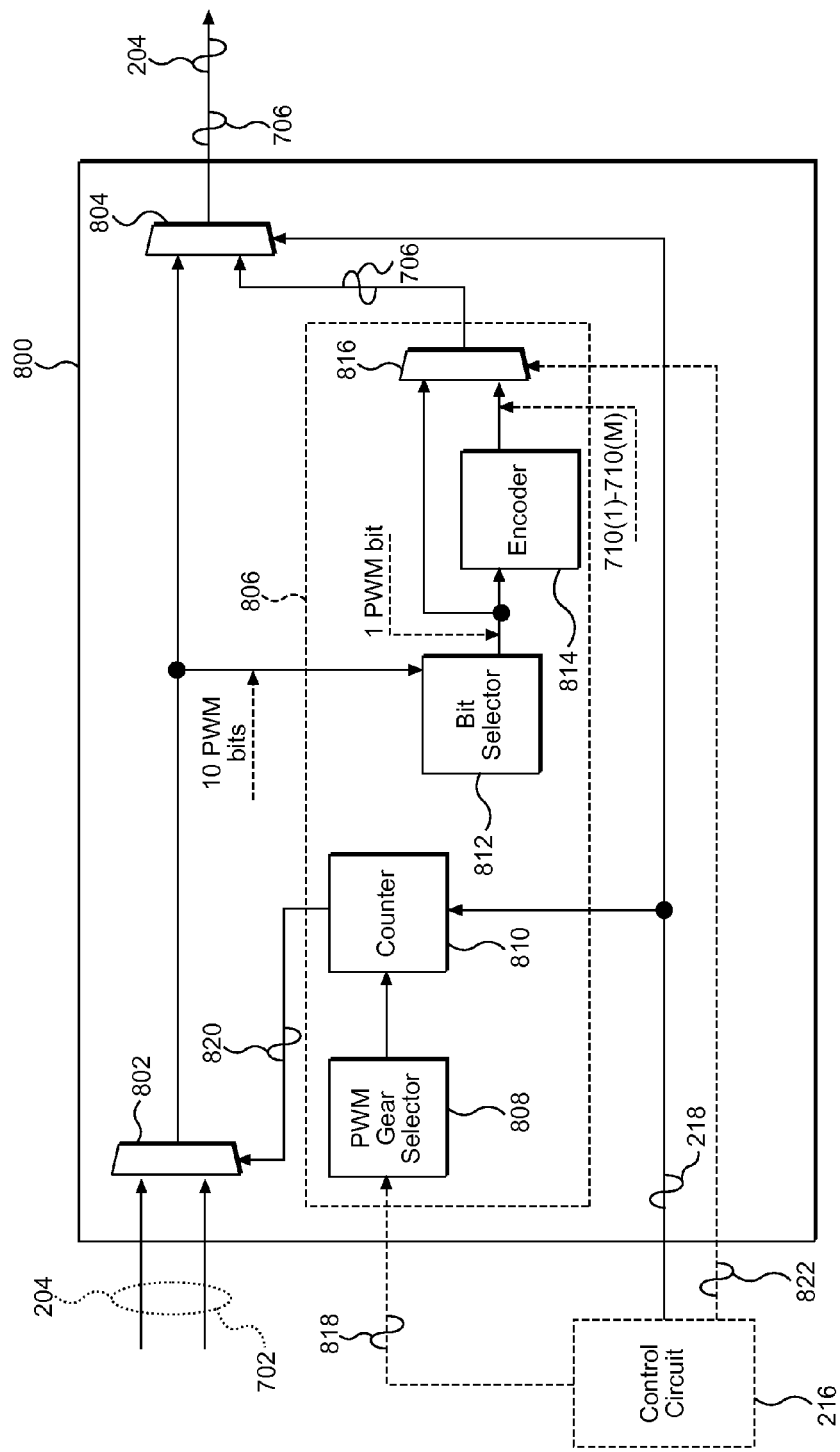
FIG. 8 is a schematic diagram of an exemplary data processing circuit that can be provided in the data transmitting circuit of FIG. 7.

FIG. 8 is a schematic diagram of an exemplary data processing circuit 800 that can be provided in the data transmitting circuit 700 of FIG. 7. Common elements between FIGS. 2, 7, and 8 are shown therein with common element numbers and thus, will not be re-described herein.

With reference to FIG. 8, the data processing circuit 800 includes a first multiplexer 802, a second multiplexer 804, and a low-speed data processing circuit 806. The low-speed data processing circuit 806 is configured to encode the PWM parallel bit stream 702 into the high-speed parallel bit stream 204 according to exemplary aspects discussed with reference to FIG. 7. The low-speed data processing is enabled or disabled by the control circuit 216 via the control signal 218. The control circuit 216 disables the low-speed data processing circuit 806 when the data processing circuit 800 receives the high-speed parallel bit stream 204. As such, the data processing circuit 800 simply passes the high-speed parallel bit stream 204 from the first multiplexer 802 to the second multiplexer 804 and on to the serializer circuit 202 (not shown). The control circuit 216 enables the low-speed data processing circuit 806 when the data processing circuit 800 receives the PWM parallel bit stream 702. By enabling the low-speed data processing circuit 806, the control signal 218 directs the PWM parallel bit stream 702 to the low-speed data processing circuit 806 and prevents the PWM parallel bit stream 702 from being output directly from the second multiplexer 804.

The low-speed data processing circuit 806 includes a PWM gear selector 808, a counter 810, a bit selector 812, an encoder 814, and a third multiplexer 816. The control circuit 216 configures the PWM gear selector 808 to one of seven PWM gears (not shown) as defined by MIPI via a gear selection signal 818. In essence, the PWM gear defines the low-speed bitrate of the PWM parallel bit stream 702. As previously discussed in FIG. 7, once the low-speed bitrate and the high-speed bitrate are known, the data processing circuit 800 is able to determine the $M_B$ for encoding each of the plurality of PWM bits 718(1)(1)-718(X)(Y) (not shown) into the high-speed parallel bit stream 706.

As previously discussed in FIG. 7, each of the plurality of PWM bit periods 714(1)-714(X) (not shown) includes the second number of parallel PWM bits 716(1)-716(Y) (not shown). Further according to the non-limiting examples in Table 1, the second number of parallel PWM bits 716(1)-716(Y) equal to 20 PWM bits. As such, the counter 810 controls the first multiplexer 802 to provide 10 PWM bits among the plurality of PWM bits 718(1)(1)-718(X)(Y) to the bit selector 812 each time the counter 810 provides a PWM data fetch signal 820 to the first multiplexer 802.

The bit selector 812 receives the 10 PWM bits from the first multiplexer 802 and provides to the encoder 814 one PWM bit a time. The encoder 814 encodes the PWM bit provided by the bit selector 812 into the calculated number of binary bit periods among the plurality of binary bit periods 708(1)-708(N) according to the functional aspects and operation principles discussed in FIG. 7. Upon encoding the first number of parallel binary bits 710(1)-710(M) in each of the plurality of binary bit periods 708(1)-708(N), the encoder 814 provides the encoded first number of parallel binary bits 710(1)-710(M) to the third multiplexer 816. The third multiplexer 816 then provides the encoded first number of parallel binary bits 710(1)-710(M) to the second multiplexer 804 and on to the serializer circuit 202.

In some cases, it may be necessary to bypass the encoder 814 when the low-speed data processing circuit 806 is enabled. In this regard, the control circuit 216 may provide a PWM output signal 822 to the third multiplexer 816 to flush the 10 PWM bits received by the bit selector 812 without going through the encoder 814.

Figure 9:
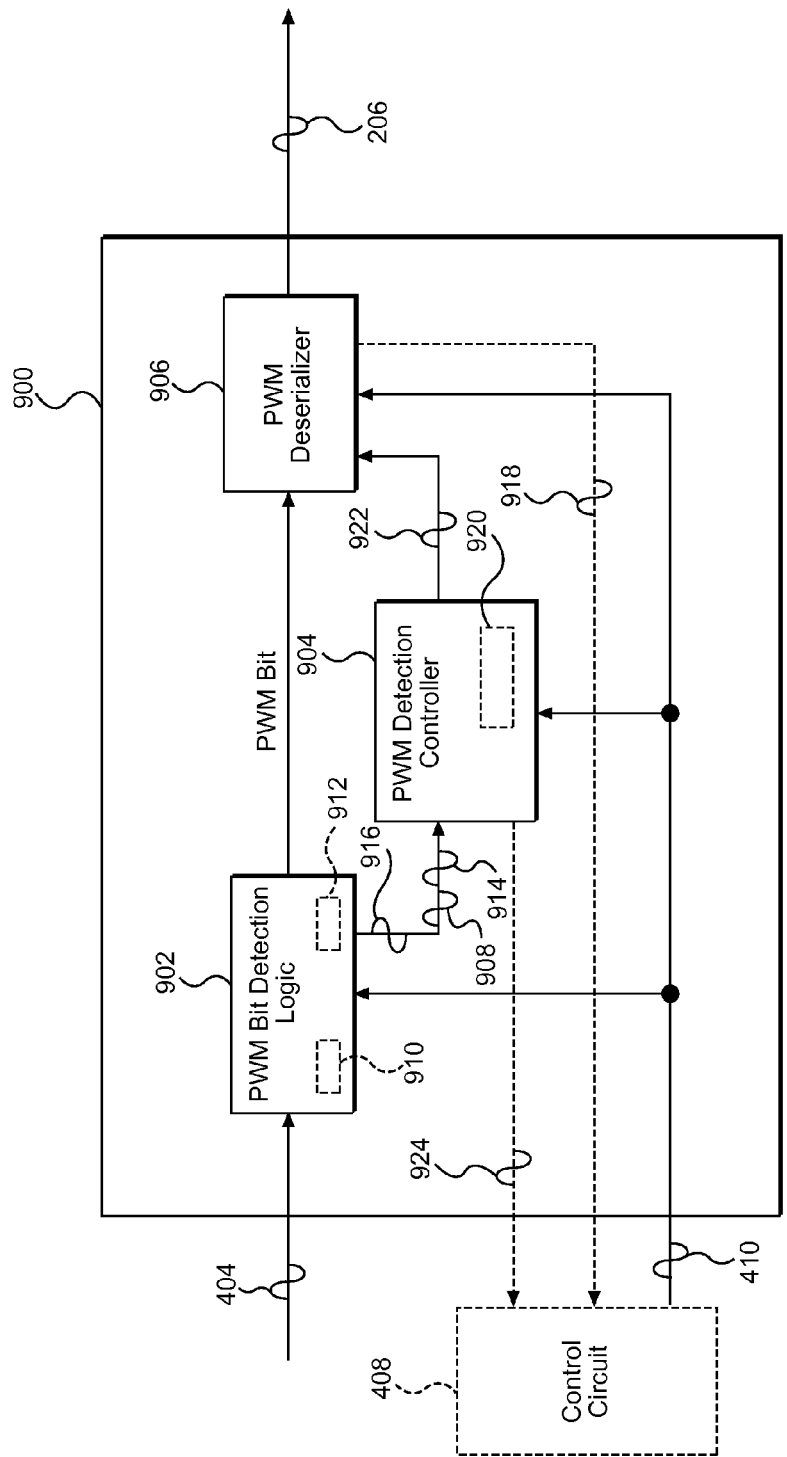
FIG. 9 is a schematic diagram of an exemplary data processing circuit that may be provided in the data receiving circuit of FIG. 4 to recover PWM bits from the high-speed serial bit stream.

As previously discussed in FIG. 4, the data processing circuit 406 is configured to recover the low-speed parallel bit stream 206 from the high-speed parallel bit stream 404. In this regard, FIG. 9 is a schematic diagram of an exemplary data processing circuit 900 that may be provided in the data receiving circuit 400 of FIG. 4 to recover PWM bits from the high-speed serial bit stream 212. Common elements between FIGS. 4, 6, and 9 are shown therein with common element numbers and thus, will not be re-described herein.

With reference to FIG. 9, the data processing circuit 900 includes a PWM bit detection logic 902, a PWM detection controller 904, and a PWM deserializer 906. As previously discussed in FIG. 6, when encoded in the digital format 602 (not shown), the PWM bit 0 (not shown) and the PWM bit 1 (not shown) start with the falling edge 608 (not shown) and end with the falling edge 610 (not shown). In addition, there is the rising edge 612 (not shown) between the falling edge 608 and the falling edge 610. As such, when the PWM bit detection logic 902 receives the high-speed parallel bit stream 404, the PWM bit detection logic 902 first looks to detect the falling edge 608. Upon detecting the falling edge 608, the PWM bit detection logic 902 provides a first falling edge indication 908 to the PWM detection controller 904. The PWM bit detection logic 902 then continues looking for the rising edge 612. In a non-limiting example, the PWM bit detection logic 902 may include a first counter 910 and a second counter 912. In this regard, for each binary bit the PWM bit detection logic 902 receives in the high-speed parallel bit stream 404, the PWM bit detection logic 902 increases the first counter 910 if the received binary bit is 0 and increases the second counter 912 if the received binary bit is 1. Upon detecting the rising edge 612, the PWM bit detection logic 902 provides a rising edge indication 914 to the PWM detection controller 904. The PWM bit detection logic 902 then continues looking for the falling edge 610. Once again, for each binary bit the PWM bit detection logic 902 receives in the high-speed parallel bit stream 404, the PWM bit detection logic 902 increases the first counter 910 if the received binary bit is 0 and increases the second counter 912 if the received binary bit is 1. Upon detecting the falling edge 610, the PWM bit detection logic 902 provides a second falling edge indication 916 to the PWM detection controller 904.

By detecting the falling edge 608, the rising edge 612, and then the falling edge 610, the PWM bit detection logic 902 has detected a PWM bit in the high-speed parallel bit stream 404. Subsequently, the PWM bit detection logic 902 determines whether the detected PWM bit is the PWM bit 0 or the PWM bit 1 based on a count of binary 0s in the first counter 910, a count of binary 1s in the second counter 912, and the predefined PWM bit format. The PWM bit detection logic 902 then provides the determined PWM bit 0 or the determined PWM bit 1 to the PWM deserializer 906. The PWM deserializer 906 provides a PWM data valid indication 918 to the control circuit 408 upon receiving a predefined number of PWM bits (e.g., 10 PWM bits) from the PWM bit detection logic 902. The PWM deserializer 906 also outputs the predefined number of PWM bits as part of the low-speed parallel bit stream 206 (not shown).

With continuing reference to FIG. 9, the PWM detection controller 904 may include a timer 920. In a non-limiting example, the PWM detection controller 904 sets the timer 920 to a predefined timeout value upon receiving the first falling edge indication 908. The PWM detection controller 904 provides a timeout indication 922 to the PWM deserializer 906 if the timer 920 expires before the PWM detection controller 904 receives the second falling edge indication 916. The timeout indication 922 indicates that the PWM bit detection logic 902 failed to detect a valid PWM bit in the high-speed parallel bit stream 404. The PWM detection controller 904 may also provide a PWM data invalid indication 924 to the control circuit 408 upon expiration of the timer 920.

Figure 10:
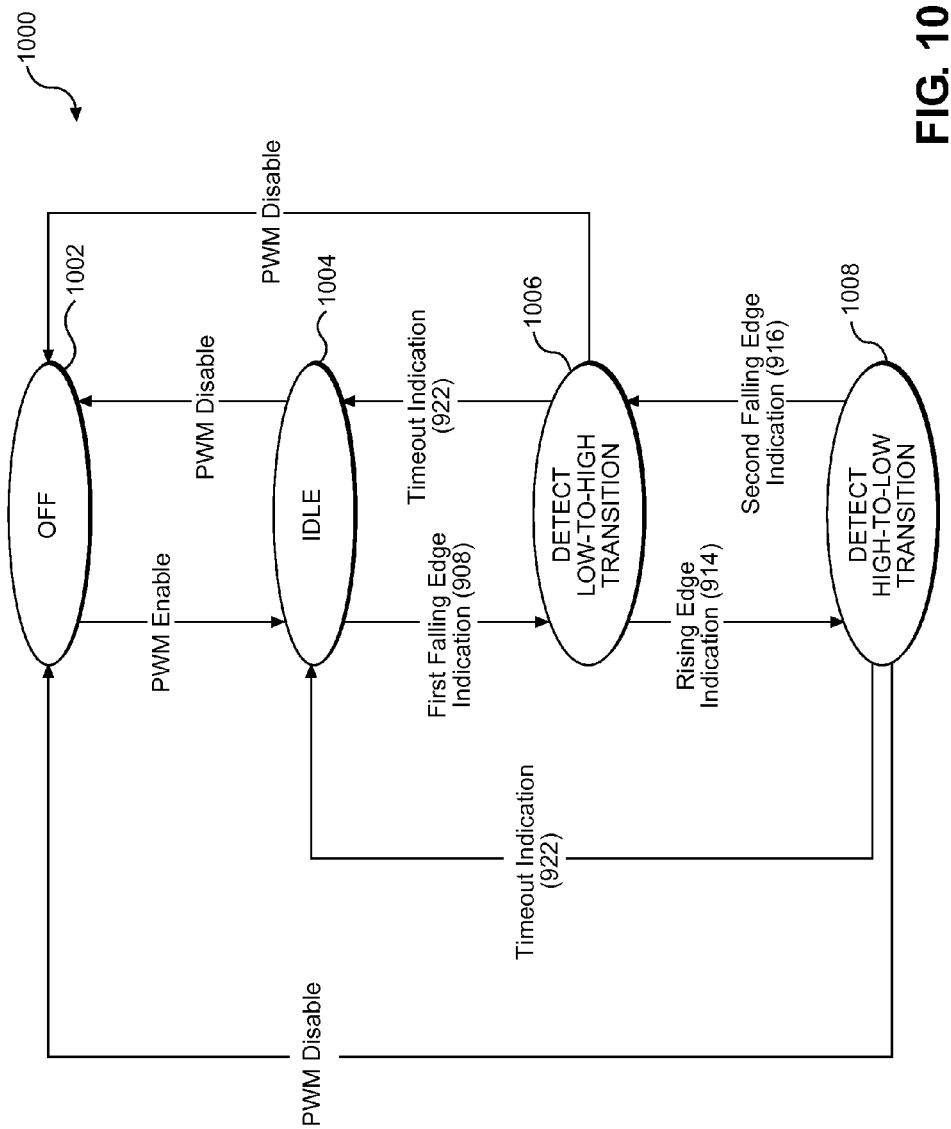
FIG. 10 is a schematic diagram of an exemplary state machine that may be implemented in the data processing circuit of FIG. 9.

The data processing circuit 900 may be configured to function according to a state machine running at the PWM detection controller 904. In this regard, FIG. 10 is a schematic diagram of an exemplary state machine 1000 that may be implemented in the data processing circuit 900 of FIG. 9. Elements of FIGS. 6 and 9 are referenced in connection with FIG. 10 and will not be re-described herein.

With reference to FIG. 10, the data processing circuit 900 (not shown) may initially stay in an OFF state 1002. The data processing circuit 900 transitions from the OFF state 1002 to an IDLE state 1004 when the data processing circuit 900 is enabled by the control signal 410 (not shown). In the IDLE state 1004, the data processing circuit 900 awaits the PWM bit detection logic 902 (not shown) to detect the falling edge 608 (not shown). The data processing circuit 900 moves from the IDLE state 1004 to a DETECT LOW-TO-HIGH TRANSITION state 1006 upon receiving the first falling edge indication 908 from the PWM bit detection logic 902. The PWM detection controller 904 (not shown) starts the timer 920 (not shown) upon entering the DETECT LOW-TO-HIGH TRANSITION state 1006.

In the DETECT LOW-TO-HIGH TRANSITION state 1006, the data processing circuit 900 awaits the PWM bit detection logic 902 to detect the rising edge 612 (not shown). The data processing circuit 900 moves from the DETECT LOW-TO-HIGH TRANSITION state 1006 to a DETECT HIGH-TO-LOW TRANSITION state 1008 upon receiving the rising edge indication 914 from the PWM bit detection logic 902. The data processing circuit 900 returns to the IDLE state 1004 if the timer 920 expires and the timeout indication 922 is generated before the rising edge indication 914 is received.

In the DETECT HIGH-TO-LOW TRANSITION state 1008, the data processing circuit 900 awaits the PWM bit detection logic 902 to detect the falling edge 610 (not shown). The data processing circuit 900 moves from the DETECT HIGH-TO-LOW TRANSITION state 1008 back to the DETECT LOW-TO-HIGH TRANSITION state 1006 upon receiving the second falling edge indication 916 from the PWM bit detection logic 902. At this point, the data processing circuit 900 has detected a PWM bit. However, if the data processing circuit 900 fails to receive the rising edge indication 914 when the timer 920 expires and the timeout indication 922 is generated, the data processing circuit 900 returns to the IDLE state 1004. In any of the IDLE state 1004, the DETECT LOW-TO-HIGH TRANSITION state 1006, and the DETECT HIGH-TO-LOW TRANSITION state 1008, the data processing circuit 900 returns to the OFF state 1002 when the data processing circuit 900 is disabled by the control signal 410. In a non-limiting example, the control signal 410 may serve to enable the data processing circuit 900 when asserted and to disable the data processing circuit 900 when de-asserted.

As previously discussed in FIG. 2, when the low-speed bitrate is not a divisor of the high-speed reference frequency 210, it may be necessary to first adjust (e.g., increase or decrease) the low-speed bitrate to an adjusted low-speed bitrate that is a divisor of the high-speed bitrate. As is further illustrated and discussed in FIG. 7, the low-speed bitrate of the PWM parallel bit stream 702 is adjusted to 200 Mbps so that each of the plurality of PWM bits 718(1)(1)-718(X)(Y) can be represented by 30 binary bits in the high-speed parallel bit stream 706. Alternatively, it may be possible to encode the plurality of PWM bits 718(1)(1)-718(X)(Y) based on a mixed-rate encoding scheme without adjusting the low-speed bitrate of the PWM parallel bit stream 702 to the adjusted low-speed bitrate that is a divisor of the high-speed bitrate.

The mixed-rate encoding scheme involves defining a first encoding bitrate and a second encoding bitrate. The first encoding bitrate is faster than the low-speed bitrate of the PWM parallel bit stream 702, and the second encoding bitrate is slower than the low-speed bitrate of the PWM parallel bit stream 702. Both the first encoding bitrate and the second encoding bitrate are divisors of the high-speed reference frequency 210. Furthermore, a division of the high-speed bitrate of the high-speed parallel bit stream 706 by the first encoding bitrate shall be a multiple of the first number of parallel binary bits 710(1)-710(M) in each of the plurality of binary bit periods 708(1)-708(N). Likewise, a division of the high-speed bitrate of the high-speed parallel bit stream 706 by the second encoding bitrate shall also be a multiple of the first number of parallel binary bits 710(1)-710(M) in each of the plurality of binary bit periods 708(1)-708(N). The plurality of PWM bits 718(1)(1)-718(X)(Y) is encoded according to an encoding bitrate ratio between the first encoding bitrate and the second encoding bitrate. As is further discussed with reference to FIG. 12 below, the encoding bitrate ratio may be determined to provide an average bitrate that matches the low-speed bitrate of the PWM parallel bit stream 702.

In a non-limiting example, the low-speed bitrate of the PWM parallel bit stream 702 may be one hundred ninety and six hundred twenty-five thousandths megabits per second (190.625 Mbps), which is neither a divisor of the high-speed reference frequency 210 (600 MHz according to Table 1) nor a divisor of the high-speed bitrate of the high-speed parallel bit stream 706 (6 Gbps according to Table 1). As such, it may be possible to select the first encoding bitrate and the second encoding bitrate as 200 Mbps and one hundred megabits per second (100 Mbps), respectively.

In this regard, the first encoding bitrate (200 Mbps) is higher than the low-speed bitrate of the PWM parallel bit stream 702 (192.625 Mbps) and is a divisor of the high-speed bitrate of the high-speed parallel bit stream 706 (6 Gbps). According to Equation 2 above, a PWM bit among the plurality of PWM bits 718(1)(1)-718(X)(Y) will be encoded into 30 binary bits in the high-speed parallel bit stream 706. The second encoding bitrate (100 Mbps) is lower than the low-speed bitrate of the PWM parallel bit stream 702 (192.625 Mbps) and is a divisor of the high-speed bitrate of the high-speed parallel bit stream 706 (6 Gbps). According to Equation 2 above, a PWM bit among the plurality of PWM bits 718(1)(1)-718(X)(Y) will be encoded into sixty (60) binary bits in the high-speed parallel bit stream 706. If the encoding bitrate ratio between the first encoding bitrate and the second encoding bitrate is twenty-nine to three (29:3), the plurality of PWM bits 718(1)(1)-718(X)(Y) will be encoded 29 times based on the first encoding bitrate and 3 times based on the second encoding bitrate. As a result, the average bitrate generated based on the encoding bitrate ratio will match the low-speed bitrate of the PWM parallel bit stream 702 (e.g., ((200 Mbps*29)+(100 Mbps*3))/(29+3)=192.625 Mbps).

Figure 11:
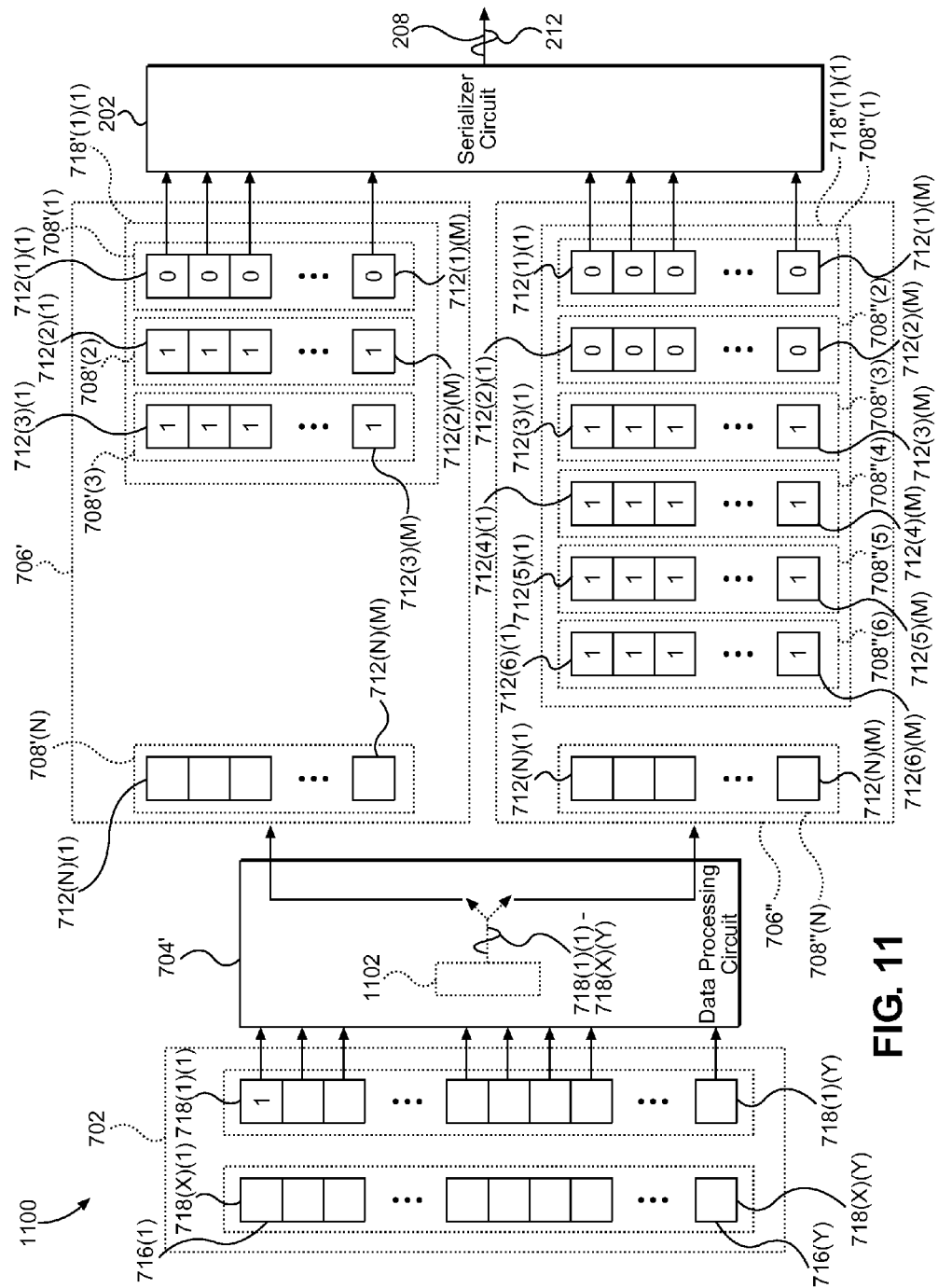
FIG. 11 is a schematic diagram of an exemplary data transmitting circuit configured to serialize the PWM parallel bit stream of FIG. 7 for transmission over the high-speed serial bus of FIG. 2 according to a mixed-rate encoding scheme.

In this regard, FIG. 11 is a schematic diagram of an exemplary data transmitting circuit 1100 configured to serialize the PWM parallel bit stream 702 of FIG. 7 for transmission over the high-speed serial bus 208 of FIG. 2 according to a mixed-rate encoding scheme. Common elements between FIGS. 2, 6, 7, and 11 are shown therein with common element numbers and thus, will not be re-described herein.

With reference to FIG. 11, the data transmitting circuit 1100 includes a data processing circuit 704'. The data processing circuit 704' includes a mixed-rate encoding controller 1102 configured to determine whether a PWM bit among the plurality of PWM bits 718(1)(1)-718(X)(Y) is encoded according to the first encoding bitrate (e.g., 200 Mbps) or the second encoding bitrate (e.g., 100 Mbps) based on the encoding bitrate ratio (e.g., 29:3) between the first encoding bitrate and the second encoding bitrate.

In this regard, if the mixed-rate encoding controller 1102 determines to encode the PWM bit 718(1)(1) based on the first encoding bitrate, the PWM bit 718(1)(1) is represented by 30 binary bits in the high-speed parallel bit stream 706. As such, the PWM bit 718(1)(1) is encoded by the data processing circuit 704' into three binary bit periods 708'(1)-708'(3) in a first high-speed PWM bit representation 718'(1)(1). Further, according to the digital format 602 (not shown) of the PWM bit 1, as discussed with reference to FIG. 6, the binary bit period 708'(1) includes 10 binary 0s and is equal to $N_0$ in the digital format 602 of the PWM bit 1. The binary bit periods 708'(2)-708'(3) each include 20 binary 1s and are equal to $N_1$ in the digital format 602 of the PWM bit 1.

In contrast, if the mixed-rate encoding controller 1102 determines to encode the PWM bit 718(1)(1) based on the second encoding bitrate, the PWM bit 718(1)(1) is represented by 60 binary bits in the high-speed parallel bit stream 706. As such, the PWM bit 718(1)(1) is encoded by the data processing circuit 704' into six binary bit periods 708"(1)-708"(6) in a second high-speed PWM bit representation 718"(1)(1). Further, according to the digital format 602 (not shown) of the PWM bit 1, as discussed with reference to FIG. 6, to maintain the 1:2 ratio between $N_0$ and $N_1$ that defines the PWM bit 1, the binary bit periods 708"(1)-708"(2) each include 10 binary 0s. The binary bit periods 708"(3)-708"(6) each include 10 binary 1s. As such, the 1:2 ratio between $N_0$ and $N_1$ that defines the PWM bit 1 is maintained in the second high-speed PWM bit representation 718"(1)(1).

With continuing reference to FIG. 7, the data processing circuit 704' outputs the first high-speed PWM bit representation 718'(1)(1) or the second high-speed PWM bit representation 718"(1)(1) according to the encoding bitrate ratio between the first encoding bitrate and the second encoding bitrate to the serializer circuit 202 that serializes the first high-speed PWM bit representation 718'(1)(1) or the second high-speed PWM bit representation 718"(1)(1) into the high-speed serial bit stream 212. Accordingly, the rest of the plurality of PWM bits 718(1)(2)-718(X)(Y) in the PWM parallel bit stream 702 can be encoded into a first high-speed parallel bit stream 706' or a second high-speed parallel bit stream 706" and subsequently serialized into the high-speed serial bit stream 212.

Figure 12:
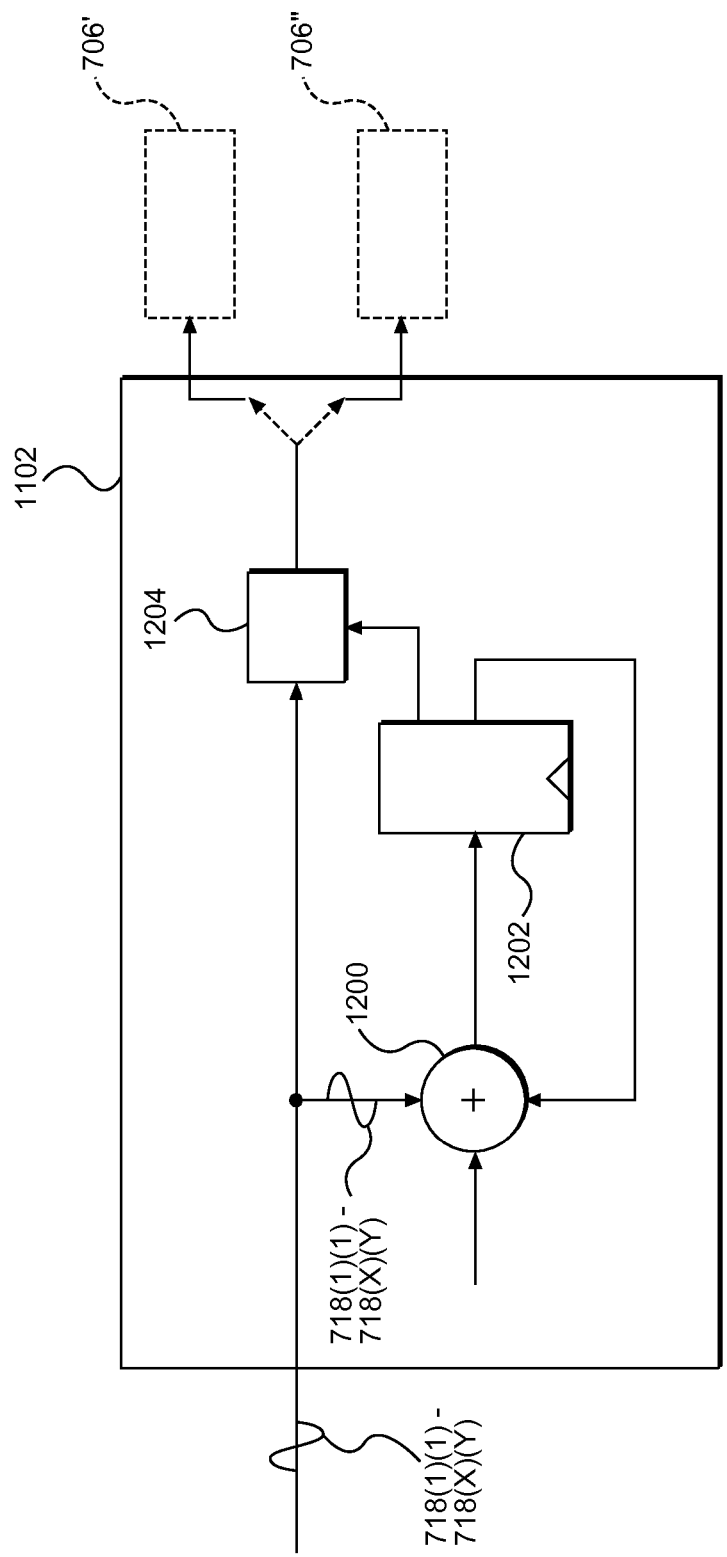
FIG. 12 is a schematic diagram providing an exemplary illustration of a mixed-rate encoding controller employed in the data transmitting circuit of FIG. 11 that supports the mixed-rate encoding scheme.

FIG. 12 is a schematic diagram providing an exemplary illustration of the mixed-rate encoding controller 1102 of FIG. 11 that supports the mixed-rate encoding scheme. Common elements between FIGS. 11 and 12 are shown therein with common element numbers and thus, will not be re-described herein. With reference to FIG. 12, the mixed-rate encoding controller 1102 includes a summing element 1200, an n-bit register 1202, and a controller 1204. The summing element 1200 is configured to increase the n-bit register 1202 by 1 for each received PWM bit among the plurality of PWM bits 718(1)(1)-718(X)(Y). The n-bit register 1202 can contain a total of two to the power of n ($2^n$) different values. In this regard, in a non-limiting example, if n is equal to six (6), the n-bit register 1202 will be a 6-bit register 1202 and can contain up to sixty-four ($64=2^6$) different values ranging from 0 to sixty-three (63). Accordingly, the 6-bit register 1202 overflows and resets to 0 after 63.

With continuing reference to FIG. 12, in a non-limiting example, the mixed-rate encoding controller 1102 may be configured to encode a PWM bit among the plurality of PWM bits 718(1)(2)-718(X)(Y) based on the second encoding bitrate when the n-bit register 1202 is 0 and encode a PWM bit among the plurality of PWM bits 718(1)(2)-718(X)(Y) based on the first encoding bitrate when the n-bit register 1202 is not zero. To set the encoding bitrate ratio (e.g., 29:3) between the first encoding bitrate and the second encoding bitrate, the summing element 1200 is initialized to a control value that is hereinafter referred to as "GAIN." In this regard, the encoding bitrate ratio between the first encoding bitrate and the second encoding bitrate can be determined based on Equation 3 (Eq. 3) below.

$$\text{Encoding Bitrate Ratio} = (2^n - \text{GAIN}) : (\text{GAIN}) \qquad \text{(Eq. 3)}$$

Accordingly, the percentage of time that the mixed-rate encoding controller 1102 encodes a PWM bit among the plurality of PWM bits 718(1)(2)-718(X)(Y) based on the first encoding bitrate ($P_1$) and the second encoding bitrate ($P_2$) can be determined based on Equation 4 (Eq. 4) below.

$$P_1 = (2^n - \text{GAIN})/(2^n \times 100)$$

$$P_2 = 1 - P_1 = \text{GAIN}/(2^n \times 100) \qquad \text{(Eq. 4)}$$

According to Equations 3 and 4, when GAIN is equal to 0, $P_1$ and $P_2$ will be one hundred percent (100%) and zero percent (0%), respectively. In this regard, the mixed-rate encoding controller 1102 will encode the plurality of PWM bits 718(1)(2)-718(X)(Y) based on the first encoding bitrate only. In contrast, when GAIN is equal to $2^n$, $P_1$ and $P_2$ will be 0% and 100%, respectively. In this regard, the mixed-rate encoding controller 1102 will encode the plurality of PWM bits 718(1)(2)-718(X)(Y) based on the second encoding bitrate only. When the GAIN is greater than 0 and less than $2''$ ($0<\text{GAIN}<2''$), $P_1$ and $P_2$ will both be greater than zero. As such, the mixed-rate encoding controller 1102 will encode the plurality of PWM bits 718(1)(2)-718(X)(Y) based on the first encoding bitrate and the second encoding bitrate according to $P_1$ and $P_2$. The average bitrate of the PWM parallel bit stream 702 can thus be expressed in Equation 5 (Eq. 5) below.

$$\text{Average Bitrate} = (\text{First Encoding Bitrate}) \times P_1 + (\text{Second Encoding Bitrate}) \times P_2 \qquad \text{(Eq. 5)}$$

The data transmitting circuit 200 of FIG. 2, the data receiving circuit 400 of FIG. 4, the data transmitting circuit 700 of FIG. 7, the data processing circuit 800 of FIG. 8, the data processing circuit 900 of FIG. 9, and the data transmitting circuit 1100 of FIG. 11 according to aspects disclosed herein may be connected to any processor-based device. Examples, without limitation, include a set top box, an entertainment unit, a navigation device, a communications device, a fixed location data unit, a mobile location data unit, a mobile phone, a cellular phone, a smart phone, a tablet, a phablet, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, and an automobile.

Figure 13:
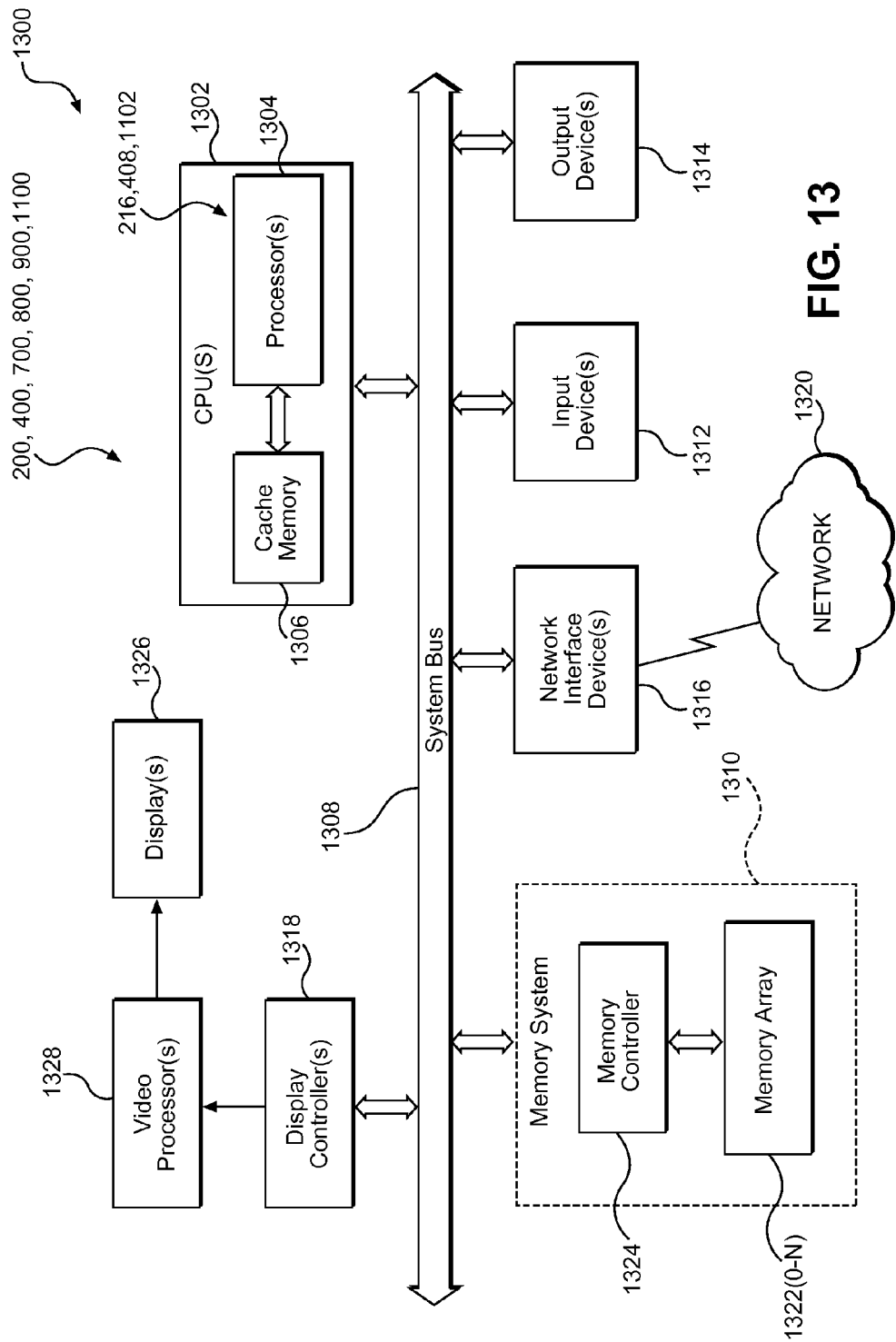
FIG. 13 is a block diagram of an exemplary processor-based system that can include the data transmitting circuit of FIG. 2, the data receiving circuit of FIG. 4, the data transmitting circuit of FIG. 7, the data processing circuit of FIG. 8, the data processing circuit of FIG. 9, and the data transmitting circuit of FIG. 11.

In this regard, FIG. 13 illustrates an example of a processor-based system 1300 that can support the data transmitting circuit 200 of FIG. 2, the data receiving circuit 400 of FIG. 4, the data transmitting circuit 700 of FIG. 7, the data processing circuit 800 of FIG. 8, the data processing circuit 900 of FIG. 9, and the data transmitting circuit 1100 of FIG. 11. In this example, the processor-based system 1300 includes one or more central processing units (CPUs) 1302, each including one or more processors 1304. In a non-limiting example, the one or more processors 1304 may support functionalities of the control circuit 216, the control circuit 408, and/or the mixed-rate encoding controller 1102 of FIGS. 2, 4, and 11, respectively. The CPU(s) 1302 may have cache memory 1306 coupled to the processor(s) 1104 for rapid access to temporarily stored data. The CPU(s) 1302 is coupled to a system bus 1308. As is well known, the CPU(s) 1302 communicates with other devices by exchanging address, control, and data information over the system bus 1308. Although not illustrated in FIG. 13, multiple system buses 1308 could be provided, wherein each system bus 1308 constitutes a different fabric.

Other master and slave devices can be connected to the system bus 1308. As illustrated in FIG. 13, these devices can include a memory system 1310, one or more input devices 1312, one or more output devices 1314, one or more network interface devices 1316, and one or more display controllers 1318, as examples. The input device(s) 1312 can include any type of input device, including, but not limited to, input keys, switches, voice processors, etc. The output device(s) 1314 can include any type of output device, including, but not limited to, audio, video, other visual indicators, etc. The network interface device(s) 1316 can be any device configured to allow exchange of data to and from a network 1320. The network 1320 can be any type of network, including, but not limited to, a wired or wireless network, a private or public network, a local area network (LAN), a wireless local area network (WLAN), a wide area network (WAN), a BLUETOOTH™ network, or the Internet. The network interface device(s) 1316 can be configured to support any type of communications protocol desired. The memory system 1310 can include one or more memory units 1322 (0-N) and a memory controller 1324.

The CPU(s) 1302 may also be configured to access the display controller(s) 1318 over the system bus 1308 to control information sent to one or more displays 1326. The display controller(s) 1318 sends information to the display(s) 1326 to be displayed via one or more video processors 1328, which process the information to be displayed into a format suitable for the display(s) 1326. The display(s) 1326 can include any type of display, including, but not limited to, a cathode ray tube (CRT), a liquid crystal display (LCD), a plasma display, a light emitting diode (LED) display, etc.

Those of skill in the art will further appreciate that the various illustrative logical blocks, modules, circuits, and algorithms described in connection with the aspects disclosed herein may be implemented as electronic hardware, instructions stored in memory or in another computer readable medium and executed by a processor or other processing device, or combinations of both. The master devices and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices (e.g., a combination of a DSP and a microprocessor, a plurality of microprocessors, one or more microprocessors in conjunction with a DSP core, or any other such configuration).

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flowchart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A data transmitting circuit, comprising:
    a serializer circuit configured to serialize a high-speed parallel bit stream corresponding to a high-speed bitrate based on a high-speed reference frequency to generate a high-speed serial bit stream for transmission over a high-speed serial bus, wherein the high-speed parallel bit stream comprises a plurality of binary bit periods, each of the plurality of binary bit periods comprising a first number of parallel binary bits; and
    a data processing circuit configured to:
        receive a low-speed parallel bit stream corresponding to a low-speed bitrate slower than the high-speed bitrate, wherein the low-speed parallel bit stream is a pulse width modulated (PWM) parallel bit stream comprising a plurality of PWM bit periods, each of the plurality of PWM bit periods comprising a second number of parallel PWM bits;
        determine a bit multiplier value by dividing the high-speed bitrate by the low-speed bitrate; and
        for each of the second number of parallel PWM bits in each of the plurality of PWM bit periods:
            encode the PWM bit into a calculated number of binary bit periods among the plurality of binary bit periods in the high-speed parallel bit stream based on the bit multiplier value and a predefined PWM bit format, wherein the calculated number of binary bit periods is determined by dividing the bit multiplier value by the first number of parallel binary bits; and
            output the calculated number of binary bit periods to the serializer circuit.

2. The data transmitting circuit of claim 1, wherein the data processing circuit is further configured to receive the high-speed parallel bit stream and pass the received high-speed parallel bit stream to the serializer circuit.

3. The data transmitting circuit of claim 1, wherein the high-speed reference frequency is a divisor of the high-speed bitrate.

4. The data transmitting circuit of claim 1, wherein the data processing circuit is further configured to increase the bit multiplier value to an integer value that is a multiple of the first number of parallel binary bits if the bit multiplier value divided by the first number of parallel binary bits in each of the plurality of binary bit periods has a remainder.

5. The data transmitting circuit of claim 1, wherein:
    the first number of parallel binary bits in each of the plurality of binary bit periods is equal to ten binary bits; and
    the second number of parallel PWM bits in each of the plurality of PWM bit periods is equal to twenty PWM bits.

6. The data transmitting circuit of claim 1, wherein the high-speed serial bit stream is transmitted over a MIPI Alliance (MIPI) high-speed serial bus.

7. The data transmitting circuit of claim 1 provided in a device selected from the group consisting of: a set top box; an entertainment unit; a navigation device; a communications device; a fixed location data unit; a mobile location data unit; a mobile phone; a cellular phone; a smart phone; a tablet; a phablet; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; and an automobile.

8. The data transmitting circuit of claim 3, wherein a division of the high-speed bitrate by the low-speed bitrate has a remainder.

9. The data transmitting circuit of claim 6, wherein the serializer circuit is configured to generate the high-speed serial bit stream for communication over a MIPI M-PHY bus.

10. The data transmitting circuit of claim 6, wherein the serializer circuit is configured to generate the high-speed serial bit stream for communication over a MIPI C-PHY bus.

11. A method for transmitting a low-speed parallel bit stream over a high-speed serial bus, comprising:
    receiving the low-speed parallel bit stream corresponding to a low-speed bitrate, wherein the low-speed parallel bit stream is a pulse width modulated (PWM) parallel bit stream comprising a plurality of PWM bit periods, each of the plurality of PWM bit periods comprising a second number of parallel PWM bits;
    determining a bit multiplier value by dividing a high-speed bitrate by the low-speed bitrate;
    for each of the second number of parallel PWM bits in each of the plurality of PWM bit periods:
        encoding the PWM bit into a calculated number of binary bit periods among a plurality of binary bit periods in a high-speed parallel bit stream based on the bit multiplier value and a predefined PWM bit format, wherein the calculated number of binary bit periods is determined by dividing the bit multiplier value by a first number of parallel binary bits; and
        outputting the calculated number of binary bit periods to a serializer circuit in the converted high-speed parallel bit stream; and
    serializing the converted high-speed parallel bit stream based on a high-speed reference frequency to generate a high-speed serial bit stream for transmission over the high-speed serial bus.

12. The method of claim 11, further comprising:
receiving the high-speed parallel bit stream; and
serializing the received high-speed parallel bit stream to generate the high-speed serial bit stream for transmission over the high-speed serial bus.

13. A data receiving circuit, comprising:
a deserializer circuit configured to deserialize a high-speed serial bit stream received over a high-speed serial bus based on a high-speed reference frequency to generate a high-speed parallel bit stream corresponding to a high-speed bitrate, wherein the high-speed parallel bit stream comprises a plurality of binary bit periods, each of the plurality of binary bit periods comprising a first number of parallel binary bits; and
a data processing circuit configured to:
determine whether a pulse width modulated (PWM) parallel bit stream corresponding to a low-speed bitrate slower than the high-speed bitrate exists in the high-speed parallel bit stream; and
in response to determining that the PWM parallel bit stream exists in the high-speed parallel bit stream, for each of the plurality of binary bit periods in the high-speed parallel bit stream:
receive the first number of parallel binary bits;
detect a falling edge and a rising edge among the received first number of parallel binary bits;
count a number of binary ones in the received first number of parallel binary bits before the falling edge and a number of binary zeros in the received first number of parallel binary bits between the falling edge and the rising edge;
determine whether the received first number of parallel binary bits represents a PWM bit based on the counted number of binary zeros, the counted number of binary ones, and a predefined PWM bit format that distinctively defines a valid PWM bit; and
provide the determined PWM bit to a PWM deserializer in the data processing circuit.

14. The data receiving circuit of claim 13, wherein the high-speed reference frequency is a divisor of the high-speed bitrate.

15. The data receiving circuit of claim 13, wherein the deserializer circuit is configured to deserialize the high-speed serial bit stream received over a MIPI Alliance (MIPI) high-speed serial bus.

16. The data receiving circuit of claim 13 provided in a device selected from the group consisting of: a set top box; an entertainment unit; a navigation device; a communications device; a fixed location data unit; a mobile location data unit; a mobile phone; a cellular phone; a smart phone; a tablet; a phablet; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; and an automobile.

17. The data receiving circuit of claim 14, wherein a division of the high-speed bitrate by the low-speed bitrate has a remainder.

18. The data receiving circuit of claim 15, wherein the deserializer circuit is configured to deserialize the high-speed serial bit stream received over a MIPI M-PHY bus.

19. The data receiving circuit of claim 15, wherein the deserializer circuit is configured to deserialize the high-speed serial bit stream received over a MIPI C-PHY bus.

20. A method for receiving a low-speed parallel bit stream over a high-speed serial bus, comprising:
deserializing a high-speed serial bit stream received over the high-speed serial bus based on a high-speed reference frequency to generate a high-speed parallel bit stream corresponding to a high-speed bitrate, wherein the high-speed parallel bit stream comprises a plurality of binary bit periods, each of the plurality of binary bit periods comprising a first number of parallel binary bits;
determining whether a pulse width modulated (PWM) parallel bit stream exists in the high-speed parallel bit stream; and
in response to determining that the PWM parallel bit stream exists in the high-speed parallel bit stream, for each of the plurality of binary bit periods in the high-speed parallel bit stream:
receiving the first number of parallel binary bits;
detecting a falling edge and a rising edge among the received first number of parallel binary bits;
counting a number of binary ones in the received first number of parallel binary bits before the falling edge and a number of binary zeros in the received first number of parallel binary bits between the falling edge and the rising edge; and
determining whether the received first number of parallel binary bits represents a PWM bit based on the counted number of binary zeros, the counted number of binary ones, and a predefined PWM bit format that distinctively defines a valid PWM bit.

21. A data transmitting circuit, comprising:
a serializer circuit configured to serialize a high-speed parallel bit stream corresponding to a high-speed bitrate based on a high-speed reference frequency to generate a high-speed serial bit stream for transmission over a high-speed serial bus; and
a data processing circuit configured to:
receive a low-speed parallel bit stream corresponding to a low-speed bitrate slower than the high-speed bitrate, wherein the low-speed parallel bit stream comprises a plurality of parallel bits each configured to be digitally represented by a first number of binary zeros and a second number of binary ones based on a predetermined ratio between the first number of binary zeros and the second number of binary ones;
convert the low-speed parallel bit stream into the high-speed parallel bit stream corresponding to the high-speed bitrate by converting each of the plurality of parallel bits in the low-speed parallel bit stream into the first number of binary zeros and the second number of binary ones representing the parallel bit; and
provide the converted high-speed parallel bit stream to the serializer circuit.

* * * * *